United States Patent
Kato et al.

(10) Patent No.: US 12,493,243 B2
(45) Date of Patent: Dec. 9, 2025

(54) FILM-FORMING COMPOSITION

(71) Applicant: NISSAN CHEMICAL CORPORATION, Tokyo (JP)

(72) Inventors: Kodai Kato, Toyama (JP); Satoshi Takeda, Toyama (JP); Shuhei Shigaki, Toyama (JP); Wataru Shibayama, Toyama (JP); Makoto Nakajima, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 600 days.

(21) Appl. No.: 17/916,238

(22) PCT Filed: Mar. 31, 2021

(86) PCT No.: PCT/JP2021/014019
§ 371 (c)(1),
(2) Date: Sep. 30, 2022

(87) PCT Pub. No.: WO2021/201167
PCT Pub. Date: Oct. 7, 2021

(65) Prior Publication Data
US 2023/0152699 A1 May 18, 2023

(30) Foreign Application Priority Data
Mar. 31, 2020 (JP) .................. 2020-064359

(51) Int. Cl.
G03F 7/075 (2006.01)
G03F 7/11 (2006.01)
G03F 7/20 (2006.01)
G03F 7/32 (2006.01)
H01L 21/027 (2006.01)
H01L 21/3065 (2006.01)
H01L 21/308 (2006.01)
H01L 21/311 (2006.01)

(52) U.S. Cl.
CPC .............. *G03F 7/0755* (2013.01); *G03F 7/11* (2013.01); *G03F 7/2004* (2013.01); *G03F 7/2043* (2013.01); *G03F 7/322* (2013.01); *H01L 21/0275* (2013.01); *H01L 21/0276* (2013.01); *H01L 21/3065* (2013.01); *H01L 21/3081* (2013.01); *H01L 21/3086* (2013.01); *H01L 21/31138* (2013.01)

(58) Field of Classification Search
CPC ........ G03F 7/0755; G03F 7/11; G03F 7/2004; G03F 7/2043; G03F 7/322; G03F 7/0752; C08G 77/06; C08G 77/80; C08G 77/14; C08G 77/20
See application file for complete search history.

(56) References Cited

U.S. PATENT DOCUMENTS

| | | |
|---|---|---|
| 2004/0247900 A1 | 12/2004 | Ogihara et al. |
| 2005/0277756 A1 | 12/2005 | Iwabuchi et al. |
| 2011/0143149 A1 | 6/2011 | Shibayama et al. |
| 2015/0118396 A1* | 4/2015 | Wakayama ............... C09D 5/00 427/258 |
| 2017/0153549 A1* | 6/2017 | Shibayama .......... C09D 183/04 |
| 2017/0168397 A1* | 6/2017 | Shibayama ............ C08G 77/28 |
| 2017/0371242 A1* | 12/2017 | Wakayama .......... C09D 183/06 |
| 2021/0054231 A1 | 2/2021 | Shibayama et al. |

FOREIGN PATENT DOCUMENTS

| | | |
|---|---|---|
| JP | 2005-018054 A1 | 1/2005 |
| JP | 2005-350558 A | 12/2005 |
| JP | 2008-083668 A | 4/2008 |
| WO | 2010/021290 A1 | 2/2010 |
| WO | 2016/080217 A1 | 5/2016 |
| WO | 2019/124514 A1 | 6/2019 |

OTHER PUBLICATIONS

Aug. 15, 2023 Office Action issued in Chinese Patent Application No. 202180024987.9.
Jan. 5, 2024 Office Action issued in Chinese Patent Application No. 202180024987.9.
Jul. 31, 2024, Office Action issued in Taiwanese Patent Application No. 110111932.
Jun. 22, 2021 Search Report issued in International Patent Application No. PCT/JP2021/014019.
Jun. 22, 2021 Written Opinion of the International Searching Authority issued in International Patent Application No. PCT/JP2021/014019.
Apr. 16, 2025 Office Action issued in Japanese Patent Application No. 2022-512662.
Apr. 22, 2025 Office Action issued in Korean Patent Application No. 10-2022-7036346.
Aug. 20, 2025 Office Action issued in Japanese Patent Application No. 2022-512662.

* cited by examiner

Primary Examiner — Stewart A Fraser
(74) Attorney, Agent, or Firm — Oliff PLC

(57) ABSTRACT

A film-forming composition for forming a resist underlayer film for a solvent development type resist that is capable of forming a good resist pattern which contains a hydrolysis-condensation product of a hydrolyzable silane compound, at least one substance that is selected from the group consisting of an aminoplast crosslinking agent and a phenoplast crosslinking agent, and a solvent, and wherein the hydrolyzable silane compound contains a hydrolyzable silane represented by formula (1).

17 Claims, No Drawings

FILM-FORMING COMPOSITION

TECHNICAL FIELD

The present invention relates to a film-forming composition, a resist underlayer film formed form the film-forming composition, and a method for producing a semiconductor device by use of the film-forming composition. More particularly, the present invention relates to a film-forming composition for forming a resist underlayer film serving as a hard mask used for an underlayer of a negative photoresist in a lithographic process for the production of a semiconductor device.

BACKGROUND ART

Fine processing by lithography using photoresists has been conventionally performed in the production of semiconductor devices. The fine processing is a processing method involving formation of a photoresist thin film on a semiconductor substrate (e.g., a silicon wafer); irradiation of the thin film with active rays (e.g., ultraviolet rays) through a mask pattern having a semiconductor device pattern drawn thereon; development of the irradiated thin film; and etching of the substrate with the resultant photoresist pattern serving as a protective film, to thereby form, on the surface of the substrate, fine irregularities corresponding to the pattern.

In recent years, active rays having a shorter wavelength have tended to be used (i.e., shifting from KrF excimer laser (248 nm) or ArF excimer laser (193 nm) to EUV light (13.5 nm)) in association with an increase in the degree of integration of semiconductor devices. This tendency causes significant thinning of a resist. Particularly, in a tri-layer (including a resist layer, a silicon-containing resist underlayer film, and an organic underlayer film) process, the silicon-containing resist underlayer film should have the ability to prevent resist pattern collapse for the production of a highly reliable semiconductor device at high reproducibility.

Under such circumstances, there has been reported, for example, a resist underlayer film-forming composition containing a silane compound having an onium group as a technique for preventing pattern collapse (Patent Document 1).

PRIOR ART DOCUMENTS

Patent Documents

Patent Document 1: WO 2010/021290

SUMMARY OF THE INVENTION

Problems to be Solved by the Invention

With the recent progress in the semiconductor device field, an increasing demand has arisen for an improvement in techniques, including a technique for preventing pattern collapse.

In view of the above-described circumstances, an object of the present invention is to provide a film-forming composition for forming a thin film that can prevent pattern collapse and can achieve a favorable pattern when used as a resist underlayer film together with a resist film or with an organic underlayer film and a resist film in a lithographic process.

Means for Solving the Problems

The present inventors have conducted extensive studies for attaining the aforementioned object, and as a result have found that pattern collapse can be prevented and a favorable pattern can be achieved when a film formed from a composition containing a hydrolysis condensate of a hydrolyzable silane compound containing a hydrolyzable silane having a specific functional group, and at least one selected from among an aminoplast crosslinking agent and a phenoplast crosslinking agent is used as a resist underlayer film together with a resist film or with an organic underlayer film and a resist film in a lithographic process such as EB lithography or EUV lithography. The present invention has been accomplished on the basis of this finding.

Accordingly, a first aspect of the present invention is a film-forming composition comprising a hydrolysis condensate of a hydrolyzable silane compound, at least one selected from the group consisting of an aminoplast crosslinking agent and a phenoplast crosslinking agent, and a solvent, the film-forming composition being characterized in that the hydrolyzable silane compound contains a hydrolyzable silane of the following Formula (1):

$$R^1_a R^2_b Si(R)_{4-(a+b)} \quad (1)$$

(wherein $R^1$ is a group bonded to the silicon atom via an Si—C bond, and is an organic group containing at least one structure selected from among an alkoxymethylbenzene structure, a phenoxy structure, and an epoxy structure;

$R^2$ is a group bonded to the silicon atom via an Si—C bond, and is each independently a substitutable alkyl group, a substitutable aryl group, a substitutable aralkyl group, a substitutable halogenated alkyl group, a substitutable halogenated aryl group, a substitutable halogenated aralkyl group, a substitutable alkoxyalkyl group, a substitutable alkoxyaryl group, a substitutable alkoxyaralkyl group, or a substitutable alkenyl group, or an organic group containing an epoxy group, an acryloyl group, a methacryloyl group, a mercapto group, an amino group, an amide group, an alkoxy group, or a sulfonyl group, or any combination of these;

$R^3$ is a group or atom bonded to the silicon atom, and is each independently a hydroxy group, an alkoxy group, an aralkyloxy group, an acyloxy group, or a halogen atom;

a is an integer of 1;
b is an integer of 0 to 2; and
a+b is an integer of 1 to 3).

A second aspect of the present invention is the film-forming composition according to the first aspect, wherein the organic group containing a phenoxy structure is an organic group containing a phenol structure, an alkoxyalkoxybenzene structure, or an alkoxybenzene structure.

A third aspect of the present invention is the film-forming composition according to the first aspect, wherein the organic group containing an alkoxymethylbenzene structure is an organic group containing an (alkoxy)(alkoxymethyl)benzene structure.

A fourth aspect of the present invention is the film-forming composition according to any one of the first to third aspects, wherein the hydrolyzable silane compound further contains a hydrolyzable silane of the following Formula (2):

$$Si(R^{11})_4 \quad (2)$$

(wherein $R^{11}$ is a group or atom bonded to the silicon atom, and is each independently a hydroxy group, an alkoxy group, an aralkyloxy group, an acyloxy group, or a halogen atom).

A fifth aspect of the present invention is the film-forming composition according to any one of the first to fourth aspects, wherein the hydrolyzable silane compound further contains a hydrolyzable silane of the following Formula (3):

(wherein $R^{12}$ is a group bonded to the silicon atom via an Si—C bond, and is each independently a substitutable alkyl group, a substitutable aryl group, a substitutable aralkyl group, a substitutable halogenated alkyl group, a substitutable halogenated aryl group, a substitutable halogenated aralkyl group, a substitutable alkoxyalkyl group, a substitutable alkoxyaryl group, a substitutable alkoxyaralkyl group, or a substitutable alkenyl group, or an organic group containing an epoxy group, an acryloyl group, a methacryloyl group, a mercapto group, an amino group, an amide group, an alkoxy group, or a sulfonyl group, or any combination of these; and $R^{13}$ is a group or atom bonded to the silicon atom, and is each independently a hydroxy group, an alkoxy group, an aralkyloxy group, an acyloxy group, or a halogen atom).

A sixth aspect of the present invention is the film-forming composition according to any one of the first to fifth aspects, wherein the hydrolysis condensate contains a monomer unit of the hydrolyzable silane of Formula (1) in an amount of 0.1% by mole to 15% by mole.

A seventh aspect of the present invention is the film-forming composition according to any one of the first to sixth aspects, wherein the composition further comprises an acid catalyst.

An eighth aspect of the present invention is the film-forming composition according to the seventh aspect, wherein the acid catalyst contains at least one selected from the group consisting of a triphenylsulfonium trifluoromethanesulfonic acid salt and a tris(hydroxyphenyl)sulfonium trifluoromethanesulfonic acid salt.

A ninth aspect of the present invention is the film-forming composition according to any one of the first to eighth aspects, wherein the composition further comprises a curing catalyst.

A tenth aspect of the present invention is the film-forming composition according to the ninth aspect, wherein the curing catalyst contains at least one selected from the group consisting of an ammonium salt, a phosphine compound, a phosphonium salt, and a sulfonium salt.

An eleventh aspect of the present invention is the film-forming composition according to any one of the first to tenth aspects, wherein the hydrolyzable silane of Formula (1) is (4-(1-ethoxyethoxy)phenyl)trimethoxysilane, or trimethoxy(3-(2-oxiranylmethoxy)propyl)silane, or triethoxy((4-ethoxy-2-methoxyphenoxy)methyl)silane.

A twelfth aspect of the present invention is the film-forming composition according to any one of the first to eleventh aspects, wherein the composition is for forming a resist underlayer film used in a lithographic process.

A thirteenth tenth aspect of the present invention is the film-forming composition according to the twelfth aspect, wherein the lithographic process is an EB lithography or EUV lithography process.

A fourteenth aspect of the present invention is a resist underlayer film formed from the film-forming composition according to any one of the first to thirteenth aspects.

A fifteenth aspect of the present invention is a semiconductor processing substrate comprising a semiconductor substrate, and the resist underlayer film according to the fourteenth aspect.

A sixteenth aspect of the present invention is a method for producing the film-forming composition according to any one of the first to thirteenth aspects, the method comprising a step of producing the hydrolysis condensate by hydrolysis and condensation of the hydrolyzable silane compound in the presence of nitric acid; and a step of dissolving, in a solvent, the hydrolysis condensate and at least one selected from the group consisting of an aminoplast crosslinking agent and a phenoplast crosslinking agent.

A seventeenth aspect of the present invention is a method for producing a semiconductor device, the method comprising a step of forming a resist underlayer film on a semiconductor substrate from the film-forming composition according to any one of the first to thirteenth aspects; a step of forming a resist film on the resist underlayer film; a step of exposing the resist film to light; a step of developing the resist film with a solvent after the light exposure, to thereby form a resist pattern; a step of etching the resist underlayer film with the resist pattern; and a step of processing the semiconductor substrate with the patterned resist film and resist underlayer film.

An eighteenth aspect of the present invention is a method for producing a semiconductor device, the method comprising a step of forming an organic underlayer film on a semiconductor substrate; a step of forming a resist underlayer film on the organic underlayer film from the film-forming composition according to any one of the first to thirteenth aspects; a step of forming a resist film on the resist underlayer film; a step of exposing the resist film to light; a step of developing the resist film with a solvent after the light exposure, to thereby form a resist pattern; a step of etching the resist underlayer film with the resist pattern; and a step of processing the semiconductor substrate with the patterned resist film and resist underlayer film.

Effects of the Invention

When a film formed from the film-forming composition of the present invention is used as a resist underlayer film together with a resist film or with an organic underlayer film and a resist film in a lithographic process such as EB lithography or EUV lithography, pattern collapse can be prevented, and a favorable pattern can be achieved. Thus, the use of the film-forming composition is expected to produce a highly reliable semiconductor device.

It has not been elucidated why pattern collapse can be prevented when a film formed from the film-forming composition of the present invention is used as a resist underlayer film. However, the reason for this is probably as follows. The film density increases through the crosslinking reaction between the hydrolysis condensate contained in the composition and at least one crosslinking agent selected from among an aminoplast crosslinking agent and a phenoplast crosslinking agent, and thus an acid generated in the resist film can be prevented from diffusing into the resist underlayer film, whereby a light-exposed portion of the resist film is sufficiently hydrophilized, and pattern collapse by negative (solvent) development can be prevented. Alternatively, the adhesion between the resist underlayer film and the resist film increases through progress of the crosslinking reaction between the resist film and the resist underlayer film, whereby pattern collapse by negative (solvent) development can be prevented.

MODES FOR CARRYING OUT THE INVENTION

The present invention will next be described in more detail.

[Hydrolyzable Silane]

The film-forming composition of the present invention contains a hydrolysis condensate of a hydrolyzable silane compound, at least one selected from among an aminoplast crosslinking agent and a phenoplast crosslinking agent, and a solvent. The film-forming composition is characterized in that the hydrolyzable silane compound contains a hydrolyzable silane of the following Formula (1).

$$R^1_a R^2_b Si(R^3)_{4-(a+b)} \quad (1)$$

$R^1$ is a group bonded to the silicon atom via an Si—C bond, and is an organic group containing at least one structure selected from among an alkoxymethylbenzene structure, a phenoxy structure, and an epoxy structure.

In a certain embodiment, the organic group containing an epoxy structure is an organic group containing an epoxy-group-containing benzene structure.

The silicon atom may be directly bonded to, or may be bonded, via a linking group (e.g., an alkylene group), to a carbon atom or an epoxy group of the benzene ring in an alkoxymethylbenzene structure or phenoxy structure contained in the organic group.

In a certain embodiment, the silicon atom may be directly bonded to, or may be bonded, via a linking group (e.g., an alkylene group), to a carbon atom of the benzene ring in an epoxy-group-containing benzene structure contained in the organic group.

No particular limitation is imposed on the organic group containing an alkoxymethylbenzene structure, so long as the organic group contains a structure wherein an alkoxymethyl group is directly bonded to benzene. Examples of the organic group include organic groups containing a methoxymethylbenzene structure, an ethoxymethylbenzene structure, a propioxymethylbenzene structure, an alkoxyalkoxymethylbenzene structure, an alkylalkoxymethylbenzene structure, an alkenylalkoxymethylbenzene structure, an alkenyloxyalkoxymethylbenzene structure, an alkyloyloxyalkoxymethylbenzene structure, an alkyloylalkoxymethylbenzene structure, an alkane acid alkoxymethylbenzene structure, an alkene acid alkoxymethylbenzene structure, an alkyne acid alkoxymethylbenzene structure, an alkyl carbonate alkoxymethylbenzene structure, an [(oxiranyl)alkoxy]alkoxymethylbenzene structure, a 1,2-methylenedioxyalkoxymethylbenzene structure, or an alkoxymethylnaphthalene structure.

No particular limitation is imposed on the organic group containing an epoxy structure, so long as it has a structure containing an epoxy group. No particular limitation is imposed on the epoxy-group-containing benzene structure, so long as the structure contains an epoxy group and a benzene ring. Examples of the organic group containing an epoxy structure include organic groups containing an alkylepoxy group, a cycloalkylepoxy group, an oxatricycloalkyl group, an oxabicycloalkyl group, an alkoxymethyloxiranyl group, a phenoxymethyloxiranyl group, an oxatricycloalkoxymethyloxiranyl group, and an oxabicycloalkoxymethyloxiranyl group.

No particular limitation is imposed on the organic group containing a phenoxy structure, so long as the organic group contains a benzene structure directly bonded to an oxygen atom. Examples of the organic group include organic groups containing a phenol structure, an alkoxybenzene structure, an alkoxyalkoxybenzene structure, an alkenyloxybenzene structure, a phenoxybenzene structure, an alkane acid phenyl structure, an alkene acid phenyl structure, a phenoxyalkylenebenzene structure, an alkyl carbonate phenyl structure, an [(oxiranyl)alkoxy]benzene structure, a 1,2-methylenedioxybenzene structure, or an alkoxynaphthalene structure.

Of these, preferred is an organic group containing a phenol structure, an alkoxyphenyl structure, or an alkoxyalkoxyphenyl structure, from the viewpoint of achieving prevention of pattern collapse at high reproducibility.

$R^2$ is a group bonded to the silicon atom via an Si—C bond, and is each independently a substitutable alkyl group, a substitutable aryl group, a substitutable aralkyl group, a substitutable halogenated alkyl group, a substitutable halogenated aryl group, a substitutable halogenated aralkyl group, a substitutable alkoxyalkyl group, a substitutable alkoxyaryl group, a substitutable alkoxyaralkyl group, or a substitutable alkenyl group, or an organic group containing an epoxy group, an acryloyl group, a methacryloyl group, a mercapto group, an amino group, an amide group, an alkoxy group, or a sulfonyl group, or any combination of these. The term "substitutable" as used herein refers to the case where a group may be substituted with, for example, a substituent such as an alkyl group, an aryl group, an aralkyl group, a halogenated alkyl group, a halogenated aryl group, a halogenated aralkyl group, an alkoxyalkyl group, an alkoxyaryl group, an alkoxyaralkyl group, an alkenyl group, an alkoxy group, an aryloxy group, or an aralkyloxy group, or when two or more substituents are present, the substituents may be bonded together to form a ring.

The alkyl group may have a linear, branched, or cyclic structure.

No particular limitation is imposed on the carbon atom number of the alkyl group, but the carbon atom number is preferably 40 or less, more preferably 30 or less, still more preferably 20 or less, much more preferably 10 or less.

Specific examples of the linear or branched alkyl group include, but are not limited to, methyl group, ethyl group, n-propyl group, isopropyl group, n-butyl group, isobutyl group, s-butyl group, t-butyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, and 1-ethyl-2-methyl-n-propyl group.

Specific examples of the cyclic alkyl group include, but are not limited to, cycloalkyl groups, such as cyclopropyl group, cyclobutyl group, 1-methyl-cyclopropyl group, 2-methyl-cyclopropyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-isopropyl-cyclopropyl group, 2-isopropyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group; and bicycloalkyl groups, such as bicyclobutyl group, bicyclopentyl group, bicyclohexyl group, bicycloheptyl group, bicyclooctyl group, bicyclononyl group, and bicyclodecyl group.

The aryl group may be a phenyl group, a monovalent group derived from a condensed-ring aromatic hydrocarbon compound through removal of one hydrogen atom, or a monovalent group derived from a linked-ring aromatic hydrocarbon compound through removal of one hydrogen atom. No particular limitation is imposed on the carbon atom number of the aryl group, but the carbon atom number is preferably 40 or less, more preferably 30 or less, still more preferably 20 or less.

Specific examples of the aryl group include, but are not limited to, phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 5-naphthacenyl group, 2-chrysenyl group, 1-pyrenyl group, 2-pyrenyl group, pentacenyl group, benzopyrenyl group, triphenylenyl group, biphenyl-2-yl group, biphenyl-3-yl group, biphenyl-4-yl group, p-terphenyl-4-yl group, m-terphenyl-4-yl group, o-terphenyl-4-yl group, 1,1'-binaphthyl-2-yl group, and 2,2'-binaphthyl-1-yl group.

The aralkyl group is an alkyl group substituted with an aryl group, and specific examples of the aryl group and the alkyl group are the same as those described above.

No particular limitation is imposed on the carbon atom number of the aralkyl group, but the carbon atom number is preferably 40 or less, more preferably 30 or less, still more preferably 20 or less.

Specific examples of the aralkyl group include, but are not limited to, phenylmethyl group (benzyl group), 2-phenyl-ethylene group, 3-phenyl-n-propyl group, 4-phenyl-n-butyl group, 5-phenyl-n-pentyl group, 6-phenyl-n-hexyl group, 7-phenyl-n-heptyl group, 8-phenyl-n-octyl group, 9-phenyl-n-nonyl group, and 10-phenyl-n-decyl group.

The halogenated alkyl group is an alkyl group substituted with a halogen atom, and specific examples of the alkyl group are the same as those described above.

No particular limitation is imposed on the carbon atom number of the halogenated alkyl group, but the carbon atom number is preferably 40 or less, more preferably 30 or less, still more preferably 20 or less, much more preferably 10 or less.

Examples of the halogen atom include a fluorine atom, a chlorine atom, a bromine atom, and an iodine atom.

Specific examples of the halogenated alkyl group include, but are not limited to, monofluoromethyl group, difluoromethyl group, trifluoromethyl group, bromodifluoromethyl group, 2-chloroethyl group, 2-bromoethyl group, 1,1-difluoroethyl group, 2,2,2-trifluoroethyl group, 1,1,2,2-tetrafluoroethyl group, 2-chloro-1,1,2-trifluoroethyl group, pentafluoroethyl group, 3-bromopropyl group, 2,2,3,3-tetrafluoropropyl group, 1,1,2,3,3,3-hexafluoropropyl group, 1,1,1,3,3,3-hexafluoropropan-2-yl group, 3-bromo-2-methylpropyl group, 4-bromobutyl group, and perfluoropentyl group.

The halogenated aryl group is an aryl group substituted with a halogen atom, and specific examples of the aryl group and the halogen atom are the same as those described above.

No particular limitation is imposed on the carbon atom number of the halogenated aryl group, but the carbon atom number is preferably 40 or less, more preferably 30 or less, still more preferably 20 or less.

Specific examples of the halogenated aryl group include, but are not limited to, 2-fluorophenyl group, 3-fluorophenyl group, 4-fluorophenyl group, 2,3-difluorophenyl group, 2,4-difluorophenyl group, 2,5-difluorophenyl group, 2,6-difluorophenyl group, 3,4-difluorophenyl group, 3,5-difluorophenyl group, 2,3,4-trifluorophenyl group, 2,3,5-trifluorophenyl group, 2,3,6-trifluorophenyl group, 2,4,5-trifluorophenyl group, 2,4,6-trifluorophenyl group, 3,4,5-trifluorophenyl group, 2,3,4,5-tetrafluorophenyl group, 2,3,4,6-tetrafluorophenyl group, 2,3,5,6-tetrafluorophenyl group, pentafluorophenyl group, 2-fluoro-1-naphthyl group, 3-fluoro-1-naphthyl group, 4-fluoro-1-naphthyl group, 6-fluoro-1-naphthyl group, 7-fluoro-1-naphthyl group, 8-fluoro-1-naphthyl group, 4,5-difluoro-1-naphthyl group, 5,7-difluoro-1-naphthyl group, 5,8-difluoro-1-naphthyl group, 5,6,7,8-tetrafluoro-1-naphthyl group, heptafluoro-1-naphthyl group, 1-fluoro-2-naphthyl group, 5-fluoro-2-naphthyl group, 6-fluoro-2-naphthyl group, 7-fluoro-2-naphthyl group, 5,7-difluoro-2-naphthyl group, and heptafluoro-2-naphthyl group.

The halogenated aralkyl group is an aralkyl group substituted with a halogen atom, and specific examples of the aralkyl group and the halogen atom are the same as those described above.

No particular limitation is imposed on the carbon atom number of the halogenated aralkyl group, but the carbon atom number is preferably 40 or less, more preferably 30 or less, still more preferably 20 or less.

Specific examples of the halogenated aralkyl group include, but are not limited to, 2-fluorobenzyl group, 3-fluorobenzyl group, 4-fluorobenzyl group, 2,3-difluorobenzyl group, 2,4-difluorobenzyl group, 2,5-difluorobenzyl group, 2,6-difluorobenzyl group, 3,4-difluorobenzyl group, 3,5-difluorobenzyl group, 2,3,4-trifluorobenzyl group, 2,3,5-trifluorobenzyl group, 2,3,6-trifluorobenzyl group, 2,4,5-trifluorobenzyl group, 2,4,6-trifluorobenzyl group, 2,3,4,5-tetrafluorobenzyl group, 2,3,4,6-tetrafluorobenzyl group, 2,3,5,6-tetrafluorobenzyl group, and 2,3,4,5,6-pentafluorobenzyl group.

The alkoxyalkyl group is an alkyl group substituted with an alkoxy group. In the alkoxyalkyl group, the alkyl group substituted with an alkoxy group may have a linear, branched, or cyclic structure. Specific examples of the alkyl group are the same as those described above.

No particular limitation is imposed on the carbon atom number of the alkoxyalkyl group, but the carbon atom number is preferably 40 or less, more preferably 30 or less, still more preferably 20 or less, much more preferably 10 or less.

Specific examples of the alkoxy group substituted with the alkyl group include, but are not limited to, linear or branched alkoxy groups, such as methoxy group, ethoxy group, n-propoxy group, isopropoxy group, n-butoxy group, isobutoxy group, s-butoxy group, t-butoxy group, n-pentyloxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n- propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, 1,2-dimethyl-n-butoxy group, 1,3-dimethyl-n-butoxy group, 2,2-dimethyl-n-butoxy group, 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2-trimethyl-n-propoxy group, 1-ethyl-1-methyl-n-propoxy group, and 1-ethyl-2-methyl-n-propoxy group; and cyclic alkoxy groups, such as cyclopropoxy group, cyclobutoxy group, 1-methyl-cyclopropoxy group, 2-methyl-cyclopropoxy group, cyclopentyloxy group, 1-methyl-cyclobutoxy group, 2-methyl-cyclobutoxy group, 3-methyl-cyclobutoxy group, 1,2-dimethyl-cyclopropoxy group, 2,3-dimethyl-cyclopropoxy group, 1-ethyl-cyclopropoxy group, 2-ethyl-cyclopropoxy group, cyclohexyloxy group, 1-methyl-cyclopentyloxy group, 2-methyl-cyclopentyloxy group, 3-methyl-cyclopentyloxy group, 1-ethyl-cyclobutoxy group, 2-ethyl-cyclobutoxy group, 3-ethyl-cyclobutoxy group, 1,2-dimethyl-cyclobutoxy group, 1,3-dimethyl-cyclobutoxy group, 2,2-dimethyl-cyclobutoxy group, 2,3-dimethyl-cyclobutoxy group, 2,4-dimethyl-cyclobutoxy group, 3,3-dimethyl-cyclobutoxy group, 1-n-propyl-cyclopropoxy group, 2-n-propyl-cyclopropoxy group, 1-isopropyl-cyclopropoxy group, 2-isopropyl-cyclopropoxy group, 1,2,2-trimethyl-cyclopropoxy group, 1,2,3-trimethyl-cyclopropoxy group, 2,2,3-trimethyl-cyclopropoxy group, 1-ethyl-2-methyl-cyclopropoxy group, 2-ethyl-1-methyl-cyclopropoxy group, 2-ethyl-2-methyl-cyclopropoxy group, and 2-ethyl-3-methyl-cyclopropoxy group.

Of these, the alkoxy group of the alkoxyalkyl group is preferably a lower alkyloxy group, such as a methoxy group or an ethoxy group, more preferably a methoxy group.

Specific examples of the alkoxyalkyl group include, but are not limited to, lower alkyloxy lower alkyl groups, such as methoxymethyl group, ethoxymethyl group, 1-ethoxyethyl group, 2-ethoxyethyl group, and ethoxymethyl group.

The alkoxyaryl group is an aryl group substituted with an alkoxy group, and specific examples of the alkoxy group and the aryl group are the same as those described above.

Specific examples of the alkoxyaryl group include, but are not limited to, 2-methoxyphenyl group, 3-methoxyphenyl group, 4-methoxyphenyl group, 2-(1-ethoxy)phenyl group, 3-(1-ethoxy)phenyl group, 4-(1-ethoxy)phenyl group, 2-(2-ethoxy)phenyl group, 3-(2-ethoxy)phenyl group, 4-(2-ethoxy)phenyl group, 2-methoxynaphthalen-1-yl group, 3-methoxynaphthalen-1-yl group, 4-methoxynaphthalen-1-yl group, 5-methoxynaphthalen-1-yl group, 6-methoxynaphthalen-1-yl group, and 7-methoxynaphthalen-1-yl group.

The alkoxyaralkyl group is an aralkyl group substituted with an alkoxy group, and specific examples of the alkoxy group and the aralkyl group are the same as those described above.

No particular limitation is imposed on the carbon atom number of the alkoxyalkoxy group, but the carbon atom number is preferably 40 or less, more preferably 30 or less, still more preferably 20 or less.

Specific examples of the alkoxyaralkyl group include, but are not limited to, 3-(methoxyphenyl)benzyl group and 4-(methoxyphenyl)benzyl group.

The alkenyl group may have a linear or branched structure. No particular limitation is imposed on the carbon atom number of the alkenyl group, but the carbon atom number is preferably 40 or less, more preferably 30 or less, still more preferably 20 or less, much more preferably 10 or less.

Specific examples of the alkenyl group include, but are not limited to, ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-isopropylethenyl group, 1,2-dimethyl-1-propenyl group, 1,2-dimethyl-2-propenyl group, 1-cyclopentenyl group, 2-cyclopentenyl group, 3-cyclopentenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dimethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-s-butylethenyl group, 1,3-dimethyl-1-butenyl group, 1,3-dimethyl-2-butenyl group, 1,3-dimethyl-3-butenyl group, 1-isobutylethenyl group, 2,2-dimethyl-3-butenyl group, 2,3-dimethyl-1-butenyl group, 2,3-dimethyl-2-butenyl group, 2,3-dimethyl-3-butenyl group, 2-isopropyl-2-propenyl group, 3,3-dimethyl-1-butenyl group, 1-ethyl-1-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-t-butylethenyl group, 1-methyl-1-ethyl-2-propenyl group, 1-ethyl-2-methyl-1-propenyl group, 1-ethyl-2-methyl-2-propenyl group, 1-isopropyl-1-propenyl group, 1-isopropyl-2-propenyl group, 1-methyl-2-cyclopentenyl group, 1-methyl-3-cyclopentenyl group, 2-methyl-1-cyclopentenyl group, 2-methyl-2-cyclopentenyl group, 2-methyl-3-cyclopentenyl group, 2-methyl-4-cyclopentenyl group, 2-methyl-5-cyclopentenyl group, 2-methylene-cyclopentyl group, 3-methyl-1-cyclopentenyl group, 3-methyl-2-cyclopentenyl group, 3-methyl-3-cyclopentenyl group, 3-methyl-4-cyclopentenyl group, 3-methyl-5-cyclopentenyl group, 3-methylene-cyclopentyl group, 1-cyclohexenyl group, 2-cyclohexenyl group, and 3-cyclohexenyl group.

Examples of the organic group containing an epoxy group include, but are not limited to, glycidoxymethyl group, glycidoxyethyl group, glycidoxypropyl group, glycidoxybutyl group, and epoxycyclohexyl group.

Examples of the organic group containing an acryloyl group include, but are not limited to, acryloylmethyl group, acryloylethyl group, and acryloylpropyl group.

Examples of the organic group containing a methacryloyl group include, but are not limited to, methacryloylmethyl group, methacryloylethyl group, and methacryloylpropyl group.

Examples of the organic group containing a mercapto group include, but are not limited to, ethylmercapto group, butylmercapto group, hexylmercapto group, and octylmercapto group.

Examples of the organic group containing an amino group include, but are not limited to, amino group, aminomethyl group, and aminoethyl group.

Examples of the organic group containing an amide group include groups represented by —CONR$^{41}$R$^{42}$ (R$^{41}$ and R$^{42}$ are each independently a hydrogen atom, an alkyl group, an alkenyl group, an alkynyl group, or an aryl group). Specific examples of the alkyl group, the alkenyl group, and the aryl group, and preferred carbon atom numbers thereof are the same as those described above.

Specific examples of the organic group containing an amide group include, but are not limited to, amide group, methylamide group, dimethylamide group, methylethylamide group, diethylamide group, dipropylamide group, diisopropylamide group, and dibutylamide group.

The alkynyl group may have a linear or branched structure. No particular limitation is imposed on the carbon atom number of the alkynyl group, but the carbon atom number is preferably 40 or less, more preferably 30 or less, still more preferably 20 or less, much more preferably 10 or less.

Specific examples of the alkynyl group include, but are not limited to, ethynyl group, 1-propynyl group, and 2-propynyl group.

Examples of the organic group containing an alkoxy group include the aforementioned organic groups containing an alkoxy group. Specific examples of the alkoxy group are the same as those described above.

Example of the organic group containing a sulfonyl group include sulfonylalkyl group and sulfonylaryl group. Specific examples of the alkyl group and the aryl group are the same as those described above.

R$^3$ is a group or atom bonded to the silicon atom, and is each independently a hydroxy group, an alkoxy group, an aralkyloxy group, an acyloxy group, or a halogen atom.

Specific examples of the alkoxy group, and preferred carbon atom numbers thereof are the same as those described above regarding R$^2$.

The aralkyloxy group is a group derived from an aralkyl alcohol through removal of a hydrogen atom from the hydroxy group of the alcohol. Specific examples of the aralkyl group are the same as those described above regarding R$^2$.

No particular limitation is imposed on the carbon atom number of the aralkyloxy group, but the carbon atom number is preferably 40 or less, more preferably 30 or less, still more preferably 20 or less.

Specific examples of the aralkyloxy group include, but are not limited to, phenylmethyloxy group (benzyloxy group), 2-phenylethyleneoxy group, 3-phenyl-n-propyloxy group, 4-phenyl-n-butyloxy group, 5-phenyl-n-pentyloxy group, 6-phenyl-n-hexyloxy group, 7-phenyl-n-heptyloxy group, 8-phenyl-n-octyloxy group, 9-phenyl-n-nonyloxy group, and 10-phenyl-n-decyloxy group.

The acyloxy group is a group derived from a carboxy-group-containing compound through removal of a hydrogen atom from the carboxy group of the compound. Typical examples of the acyloxy group include, but are not limited to, an alkylcarbonyloxy group, an arylcarbonyloxy group, or an aralkylcarbonyloxy group, which is respectively derived from an alkylcarboxylic acid, an arylcarboxylic acid, or an aralkylcarboxylic acid through removal of a hydrogen atom from the carboxy group of the acid. Specific examples of the alkyl group, the aryl group, and the aralkyl group of such alkylcarboxylic acid, arylcarboxylic acid, and aralkylcarboxylic acid are the same as those described above regarding R$^2$.

Specific examples of the acyloxy group include, but are not limited to, methylcarbonyloxy group, ethylcarbonyloxy group, n-propylcarbonyloxy group, isopropylcarbonyloxy group, n-butylcarbonyloxy group, isobutylcarbonyloxy group, s-butylcarbonyloxy group, t-butylcarbonyloxy group, n-pentylcarbonyloxy group, 1-methyl-n-butylcarbonyloxy group, 2-methyl-n-butylcarbonyloxy group, 3-methyl-n-butylcarbonyloxy group, 1,1-dimethyl-n-propylcarbonyloxy group, 1,2-dimethyl-n-propylcarbonyloxy group, 2,2-dimethyl-n-propylcarbonyloxy group, 1-ethyl-n-propylcarbonyloxy group, n-hexylcarbonyloxy group, 1-methyl-n-pentylcarbonyloxy group, 2-methyl-n-pentylcarbonyloxy group, 3-methyl-n-pentylcarbonyloxy group, 4-methyl-n-pentylcarbonyloxy group, 1,1-dimethyl-n-butylcarbonyloxy group, 1,2-dimethyl-n-butylcarbonyloxy group, 1,3-dimethyl-n-butylcarbonyloxy group, 2,2-dimethyl-n-butylcarbonyloxy group, 2,3-dimethyl-n-butylcarbonyloxy group, 3,3-dimethyl-n-butylcarbonyloxy group, 1-ethyl-n-butylcarbonyloxy group, 2-ethyl-n-butylcarbonyloxy group, 1,1,2-trimethyl-n-propylcarbonyloxy group, 1,2,2-trimethyl-n-propylcarbonyloxy group, 1-ethyl-1-methyl-n-propylcarbonyloxy group, 1-ethyl-2-methyl-n-propylcarbonyloxy group, phenylcarbonyloxy group, and tosylcarbonyloxy group.

Examples of the halogen atom include a fluorine atom, a chlorine atom, a bromine atom, and an iodine atom.

In Formula (1), a is 1 or 2, b is 0 or 1, and a and b satisfy a relation of a+b 2. From the viewpoint of achieving prevention of pattern collapse at high reproducibility, preferably a is 1, and more preferably a is 1 and b is 0.

Specific examples of the hydrolyzable silane of Formula (1) include, but are not limited to, those described below. In each of the following Formulae, T is each independently a hydroxy group or a C$_{1-3}$ alkoxy group, preferably a hydroxy group, a methoxy group, and an ethoxy group.

Specific examples of the hydrolyzable silane of Formula (1) wherein R$^1$ is an organic group containing an alkoxymethylbenzene structure include, but are not limited to, hydrolyzable silanes of Formulae (1-A-1) to (1-A-27) described below.

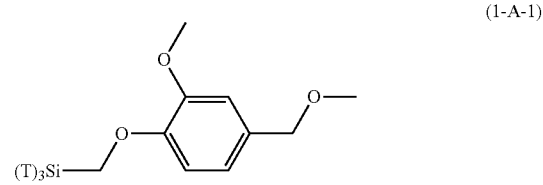

(1-A-1)

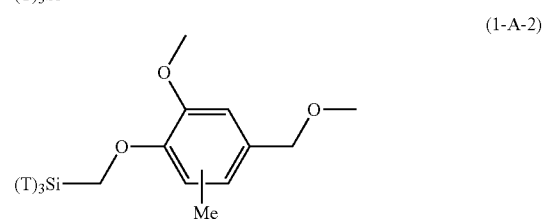

(1-A-2)

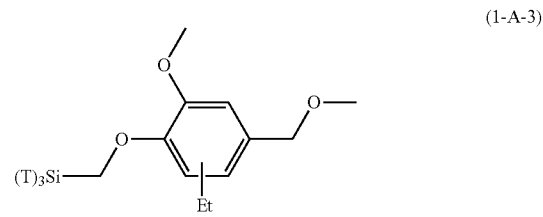

(1-A-3)

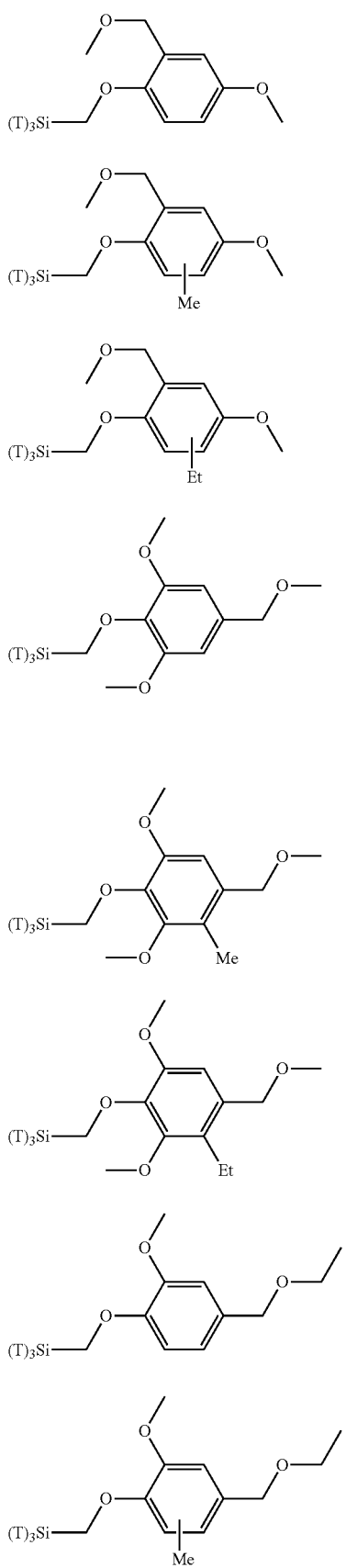
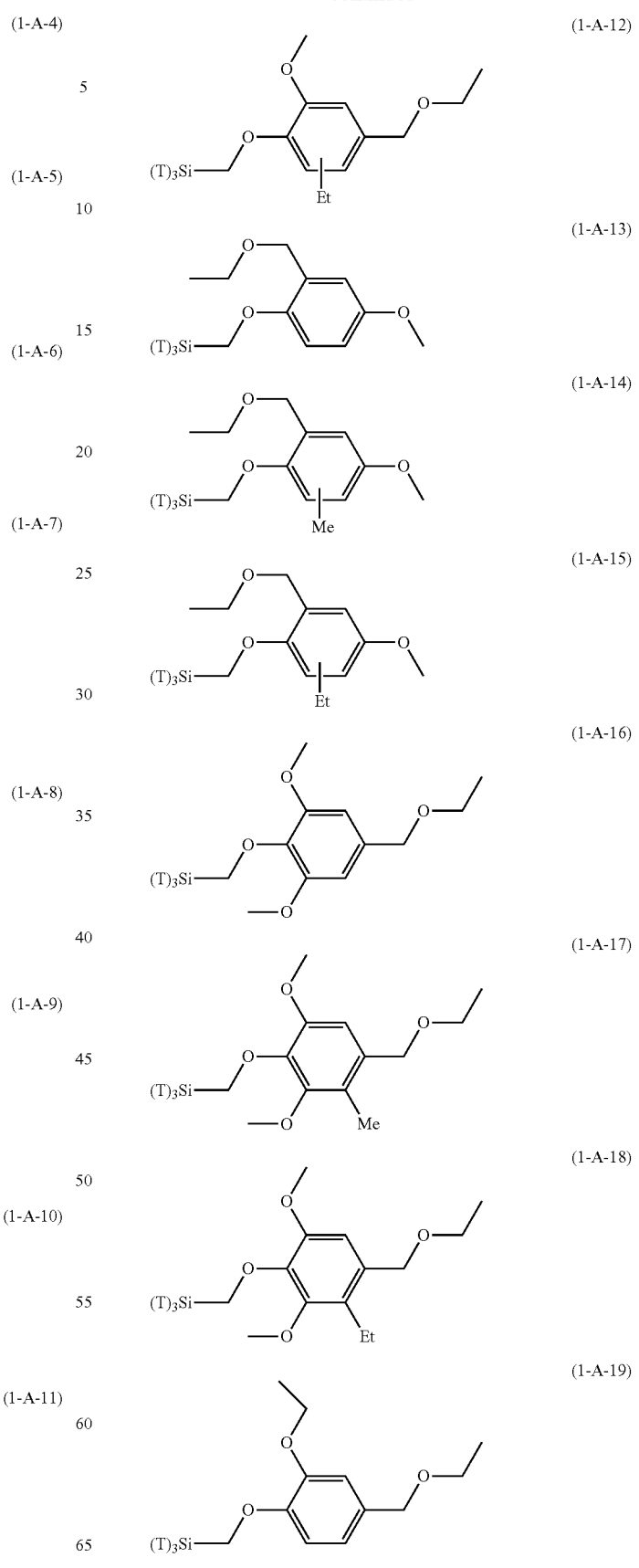

(1-A-20)
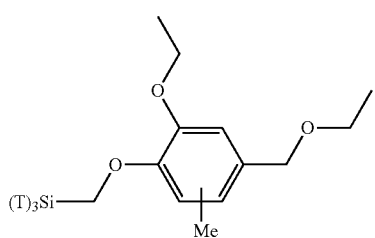
(1-A-21)
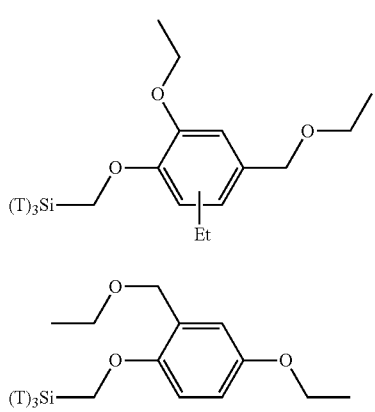
(1-A-22)
(1-A-23)
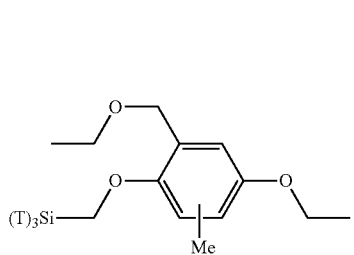
(1-A-24)
(1-A-25)
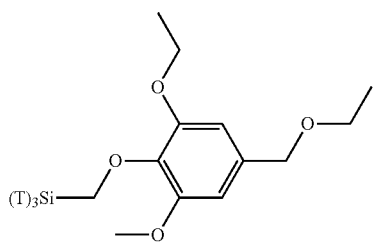
(1-A-26)
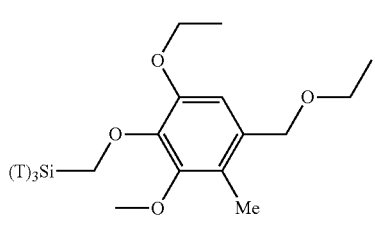
(1-A-27)
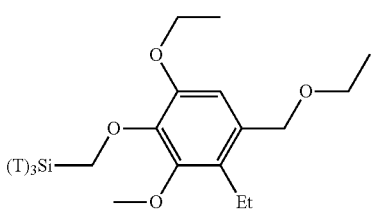
Specific examples of the hydrolyzable silane of Formula (1) wherein $R^1$ is an organic group containing a phenoxy structure include, but are not limited to, hydrolyzable silanes of Formulae (1-B-1) to (1-B-66) described below.
(1-B-1)
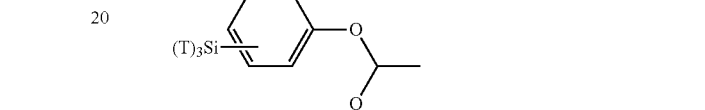
(1-B-2)
(1-B-3)
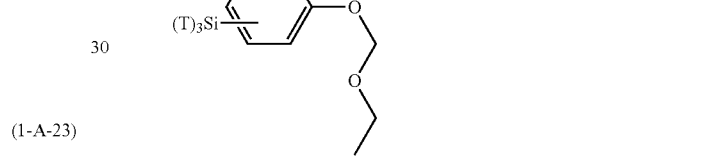
(1-B-4)
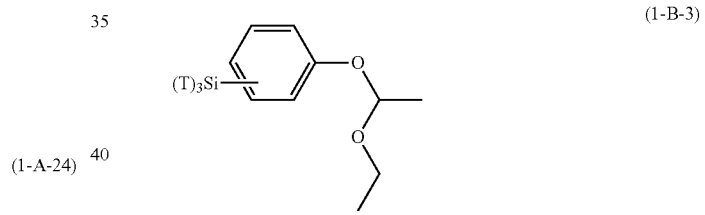
(1-B-5)
(1-B-6)
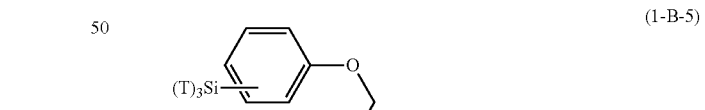
(1-B-7)
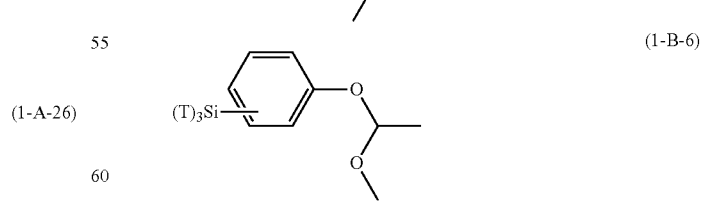

-continued
 (1-B-8)
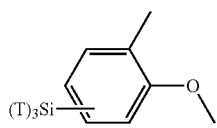 (1-B-9)
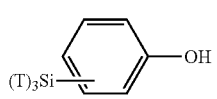 (1-B-10)
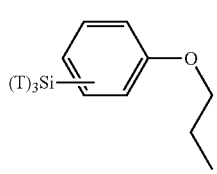 (1-B-11)
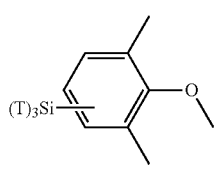 (1-B-12)
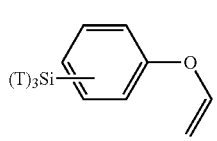 (1-B-13)
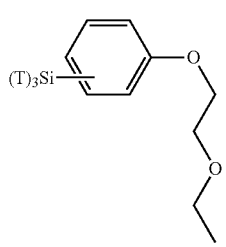 (1-B-14)
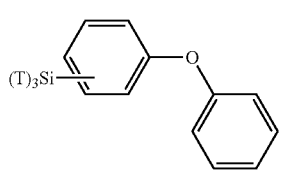 (1-B-15)
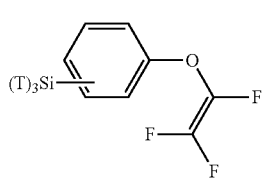 (1-B-16)
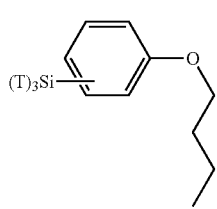 (1-B-17)
-continued
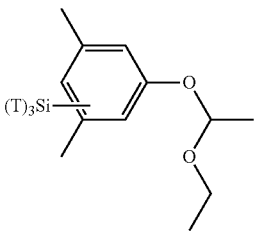 (1-B-18)
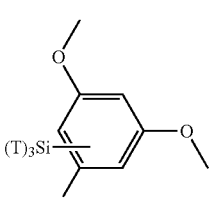 (1-B-19)
(1-B-20)
(1-B-21)
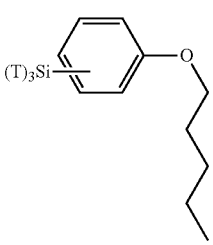 (1-B-22)
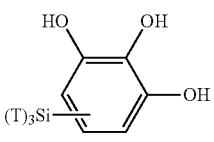 (1-B-23)
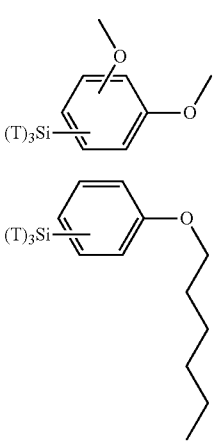 (1-B-24)

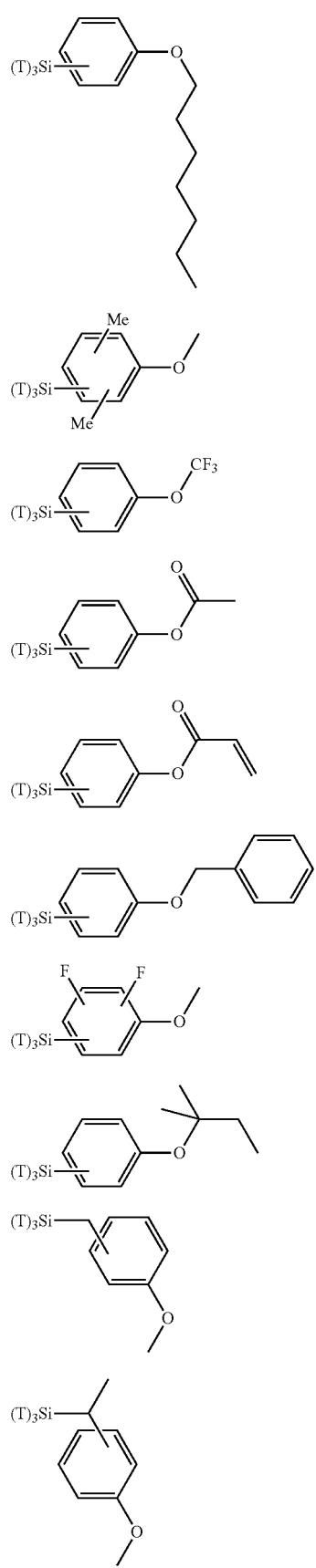

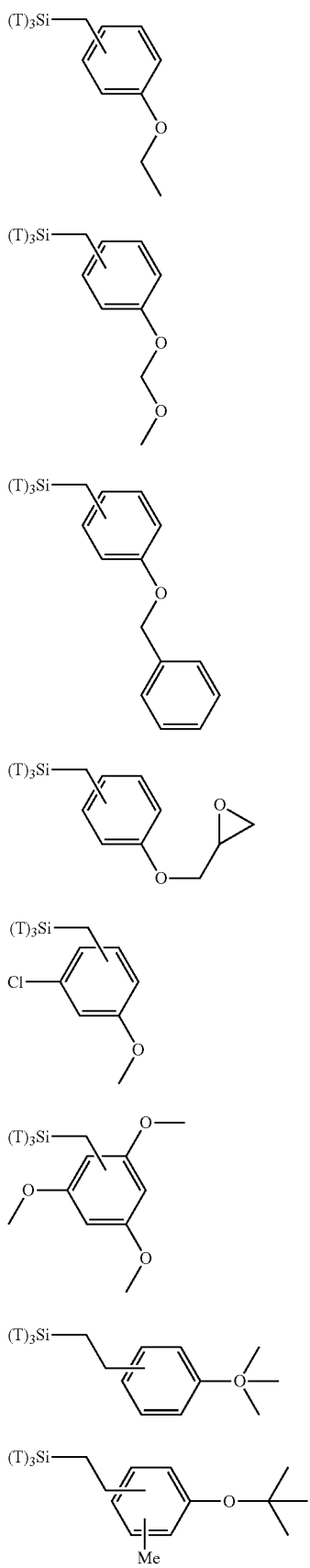
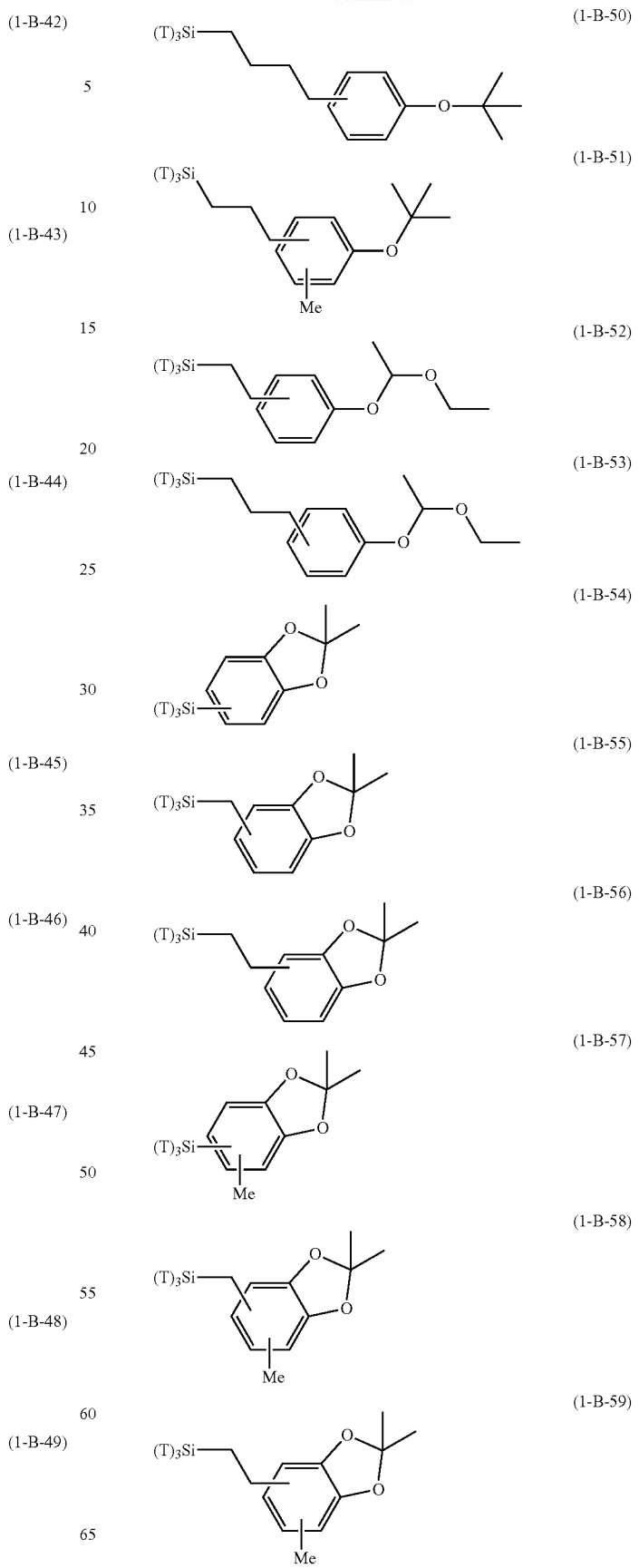

-continued

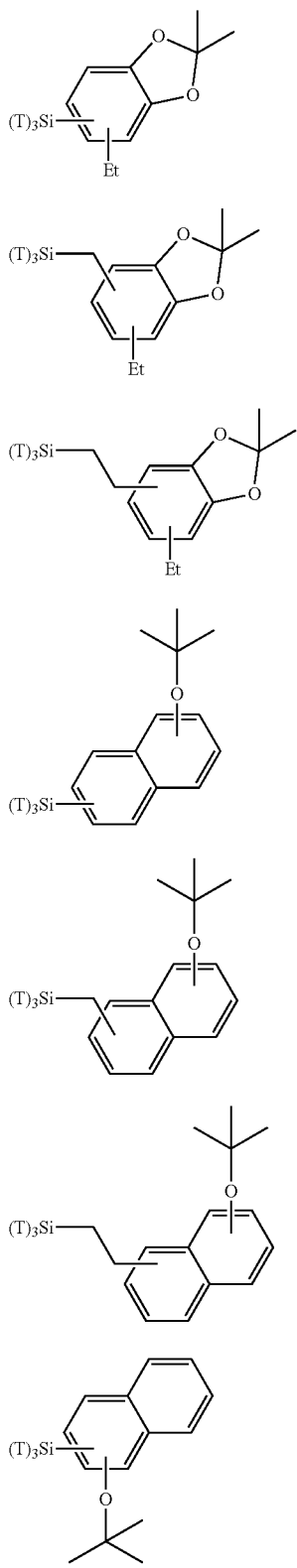

(1-B-60)

(1-B-61)

(1-B-62)

(1-B-63)

(1-B-64)

(1-B-65)

(1-B-66)

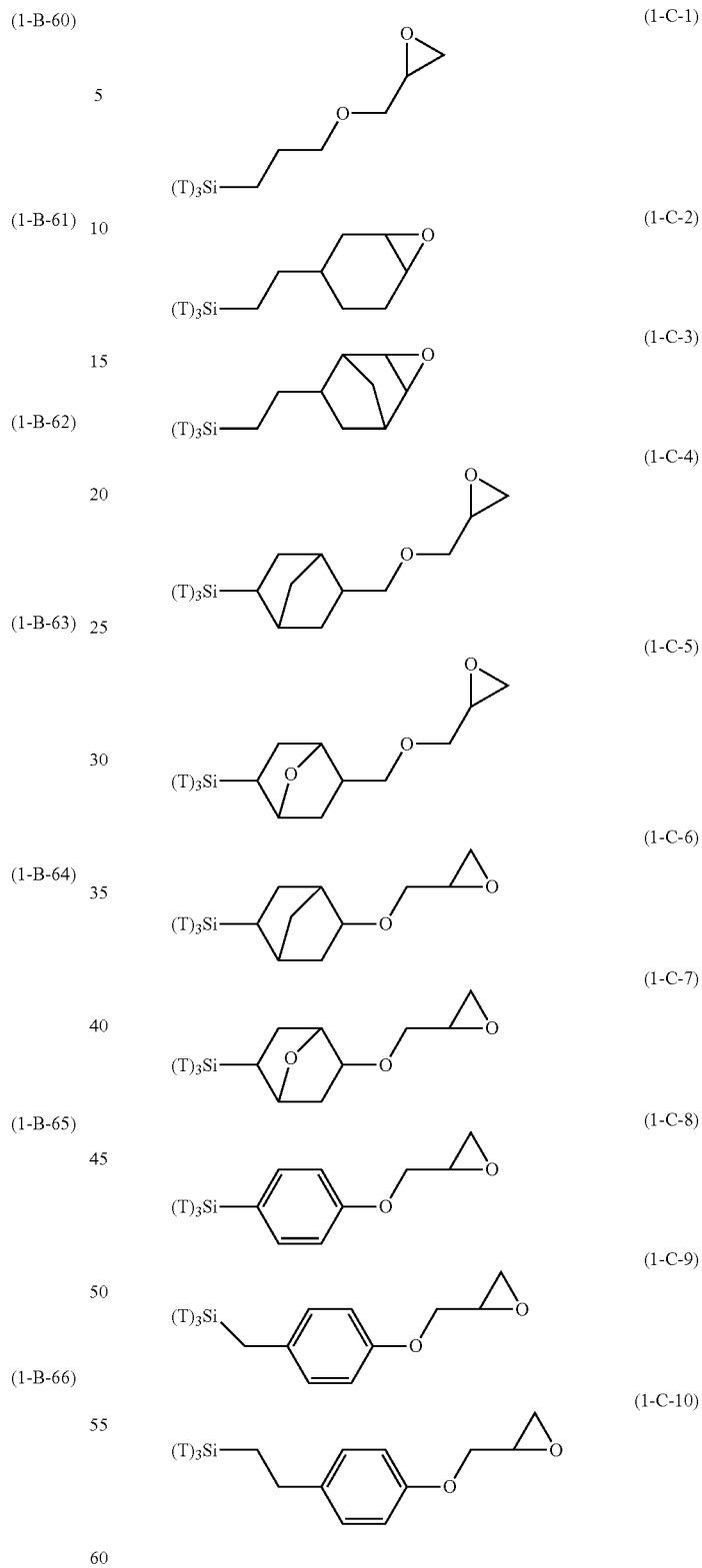

Specific examples of the hydrolyzable silane of Formula (1) wherein $R^1$ is an organic group containing an epoxy structure include, but are not limited to, hydrolyzable silanes of Formulae (1-C-1) to (1-C-10) described below.

In the present invention, the aforementioned hydrolyzable silane compound may contain at least one selected from among a hydrolyzable silane of the following Formula (2) and a hydrolyzable silane of the following Formula (3) together with the hydrolyzable silane of Formula (1) for the purpose of, for example, adjusting film properties such as film density.

$$Si(R^{11})_4 \quad (2)$$

$$R^{12}Si(R^{13})_3 \quad (3)$$

$R^{11}$ in Formula (2) and $R^{13}$ in Formula (3) are each a group or atom bonded to the silicon atom, and are each independently a hydroxy group, an alkoxy group, an aralkyloxy group, an acyloxy group, or a halogen atom.

Specific examples of the alkoxy group, the aralkyloxy group, and the acyloxy group, and preferred carbon atom numbers thereof are the same as those described above regarding $R^3$. Specific examples of the halogen atom are the same as those described above regarding $R^3$. Of these, preferred is a hydroxy group, a methoxy group, or an ethoxy group.

$R^{12}$ in Formula (3) is a group bonded to the silicon atom via an Si—C bond, and is each independently a substitutable alkyl group, a substitutable aryl group, a substitutable aralkyl group, a substitutable halogenated alkyl group, a substitutable halogenated aryl group, a substitutable halogenated aralkyl group, a substitutable alkoxyalkyl group, a substitutable alkoxyaryl group, a substitutable alkoxyaralkyl group, or a substitutable alkenyl group, or an organic group containing an epoxy group, an acryloyl group, a methacryloyl group, a mercapto group, an amino group, an amide group, an alkoxy group, or a sulfonyl group, or any combination of these.

Specific examples of the alkyl group, the aryl group, the aralkyl group, the halogenated alkyl group, the halogenated aryl group, the halogenated aralkyl group, the alkoxyalkyl group, the alkoxyaryl group, the alkoxyaralkyl group, the alkenyl group, the epoxy group, the acryloyl group, the methacryloyl group, the mercapto group, the amino group, the amide group, the alkoxy group, and the sulfonyl group, and preferred carbon atom numbers thereof are the same as those described above regarding $R^2$.

Specific examples of the hydrolyzable silane of Formula (2) include, but are not limited to, tetramethoxysilane, tetrachlorosilane, tetraacetoxysilane, tetraethoxysilane, tetra-n-propoxysilane, tetraisopropoxysilane, and tetra-n-butoxysilane.

Of these, tetramethoxysilane or tetraethoxysilane is preferred from the viewpoint of achieving prevention of pattern collapse at high reproducibility.

Specific examples of the hydrolyzable silane of Formula (3) include, but are not limited to, methyltrimethoxysilane, methyltrichlorosilane, methyltriacetoxysilane, methyltripropoxysilane, methyltributoxysilane, methyltriamyloxysilane, methyltriphenoxysilane, methyltribenzyloxysilane, methyltriphenethyloxysilane, ethyltrimethoxysilane, ethyltriethoxysilane, vinyltrimethoxysilane, vinyltrichlorosilane, vinyltriacetoxysilane, vinyltriethoxysilane, methoxyphenyltrimethoxysilane, methoxyphenyltriethoxysilane, methoxyphenyltriacetoxysilane, methoxyphenyltrichlorosilane, methoxybenzyltrimethoxysilane, methoxybenzyltriethoxysilane, methoxybenzyltriacetoxysilane, methoxybenzyltrichlorosilane, methoxyphenethyltrimethoxysilane, methoxyphenethyltriethoxysilane, methoxyphenethyltriacetoxysilane, methoxyphenethyltrichlorosilane, ethoxyphenyltrimethoxysilane, ethoxyphenyltriethoxysilane, ethoxyphenyltriacetoxysilane, ethoxyphenyltrichlorosilane, ethoxybenzyltrimethoxysilane, ethoxybenzyltriethoxysilane, ethoxybenzyltriacetoxysilane, ethoxybenzyltrichlorosilane, isopropoxyphenyltrimethoxysilane, isopropoxyphenyltriethoxysilane, isopropoxyphenyltriacetoxysilane, isopropoxyphenyltrichlorosilane, isopropoxybenzyltrimethoxysilane, isopropoxybenzyltriethoxysilane, isopropoxybenzyltriacetoxysilane, isopropoxybenzyltrichlorosilane, t-butoxyphenyltrimethoxysilane, t-butoxyphenyltriethoxysilane, t-butoxyphenyltriacetoxysilane, t-butoxyphenyltrichlorosilane, t-butoxybenzyltrimethoxysilane, t-butoxybenzyltriethoxysilane, t-butoxybenzyltriacetoxysilane, t-butoxybenzyltrichlorosilane, methoxynaphthyltrimethoxysilane, methoxynaphthyltriethoxysilane, methoxynaphthyltriacetoxysilane, methoxynaphthyltrichlorosilane, ethoxynaphthyltrimethoxysilane, ethoxynaphthyltriethoxysilane, ethoxynaphthyltriacetoxysilane, ethoxynaphthyltrichlorosilane, γ-chloropropyltrimethoxysilane, γ-chloropropyltriethoxysilane, γ-chloropropyltriacetoxysilane, 3,3,3-trifluoropropyltrimethoxysilane, γ-methacryloxypropyltrimethoxysilane, γ-mercaptopropyltrimethoxysilane, γ-mercaptopropyltriethoxysilane, β-cyanoethyltriethoxysilane, chloromethyltrimethoxysilane, and chloromethyltriethoxysilane, Of these, preferred are methyltrimethoxysilane, methyltriethoxysilane, ethyltrimethoxysilane, and ethyltriethoxysilane, from the viewpoint of achieving prevention of pattern collapse at high reproducibility.

[Hydrolysis Condensate]

The hydrolysis condensate contained in the film-forming composition of the present invention can be prepared by hydrolysis and condensation of the hydrolyzable silane compound containing the hydrolyzable silane of Formula (1).

In the present invention, the hydrolysis condensate includes a polyorganosiloxane polymer which is a condensate prepared through complete condensation, and a polyorganosiloxane polymer which is a partial hydrolysis condensate prepared through incomplete condensation. Such a partial hydrolysis condensate is a polymer prepared through hydrolysis and condensation of a hydrolyzable silane compound, as in the case of a condensate prepared through complete condensation. However, the partial hydrolysis condensate contains remaining Si—OH groups, due to partial or incomplete hydrolysis and condensation of the silane compound.

The film-forming composition of the present invention may contain, besides the hydrolysis condensate, an uncondensed hydrolysate (complete hydrolysate or partial hydrolysate) or a remaining monomer (hydrolyzable silane compound).

The hydrolysis condensate contained in the film-forming composition of the present invention is prepared by using, as a raw material, a hydrolyzable silane compound containing at least one hydrolyzable silane of Formula (1). In a preferred embodiment, the hydrolysis condensate is prepared by using, as a raw material, a hydrolyzable silane compound containing at least one hydrolyzable silane of Formula (1) and at least one hydrolyzable silane of Formula (2), or a hydrolyzable silane compound containing at least one hydrolyzable silane of Formula (1) and at least one hydrolyzable silane of Formula (3). In a more preferred embodiment, the hydrolysis condensate is prepared by using, as a raw material, a hydrolyzable silane compound containing at least one hydrolyzable silane of Formula (1), at least one hydrolyzable silane of Formula (2), and at least one hydrolyzable silane of Formula (3).

The hydrolyzable silane of any of Formulae (1) to (3) used in the present invention contains an alkoxy group, aralkyloxy group, acyloxy group, or halogen atom directly bonded to the silicon atom; specifically, a hydrolyzable group (i.e., an alkoxysilyl group, an aralkyloxysilyl group, an acyloxysilyl group, or a halogenated silyl group). For the hydrolysis and condensation of the hydrolyzable group, generally 0.5 mol to 100 mol (preferably 1 mol to 10 mol) of water is used per mol of the hydrolyzable group.

No particular limitation is imposed on the reaction temperature for the hydrolysis and condensation, so long as the hydrolysis and condensation proceed. The reaction temperature is generally 20 to 80° C.

Generally, a catalyst is used for the hydrolysis and condensation.

Examples of the catalyst include a metal chelate compound, an organic acid, an inorganic acid, an organic base, and an inorganic base. These catalysts may be used alone or in combination of two or more species.

Examples of the metal chelate compound serving as a catalyst for the hydrolysis and condensation include, but are not limited to, titanium chelate compounds, such as tri-ethoxymono(acetylacetonato)titanium, tri-n-propoxy mono(acetylacetonato)titanium, tri-isopropoxy mono(acetylacetonato)titanium, tri-n-butoxymono(acetylacetonato)titanium, tri-s-butoxy mono(acetylacetonato)titanium, tri-t-butoxymono(acetylacetonato)titanium, diethoxybis(acetylacetonato)titanium, di-n-propoxybis(acetylacetonato)titanium, di-isopropoxybis(acetylacetonato)titanium, di-n-butoxybis(acetylacetonato)titanium, di-s-butoxybis(acetylacetonato)titanium, di-t-butoxybis(acetylacetonato)titanium, monoethoxytris(acetylacetonato)titanium, mono-n-propoxy tris(acetylacetonato)titanium, mono-isopropoxytris(acetylacetonato)titanium, mono-n-butoxy tris(acetylacetonato)titanium, mono-s-butoxytris(acetylacetonato)titanium, mono-t-butoxy tris(acetylacetonato)titanium, tetrakis(acetylacetonato)titanium, triethoxymono(ethylacetoacetato)titanium, tri-n-propoxymono(ethylacetoacetato)titanium, tri-isopropoxymono(ethylacetoacetato)titanium, tri-n-butoxymono(ethylacetoacetato)titanium, tri-s-butoxymono(ethylacetoacetato)titanium, tri-t-butoxymono(ethylacetoacetato)titanium, diethoxybis(ethylacetoacetato)titanium, di-n-propoxybis(ethylacetoacetato)titanium, di-isopropoxybis(ethylacetoacetato)titanium, di-n-butoxybis(ethylacetoacetato)titanium, di-s-butoxybis(ethylacetoacetato)titanium, di-t-butoxybis(ethylacetoacetato)titanium, monoethoxytris(ethylacetoacetato)titanium, mono-n-propoxytris(ethylacetoacetato)titanium, mono-isopropoxytris(ethylacetoacetato)titanium, mono-n-butoxytris(ethylacetoacetato)titanium, mono-s-butoxytris(ethylacetoacetato)titanium, mono-t-butoxytris(ethylacetoacetato)titanium, tetrakis(ethylacetoacetato)titanium, mono(acetylacetonato)tris(ethylacetoacetato)titanium, bis(acetylacetonato)bis(ethylacetoacetato)titanium, and tris(acetylacetonato)mono(ethylacetoacetato)titanium; zirconium chelate compounds, such as triethoxymono(acetylacetonato)zirconium, tri-n-propoxymono(acetylacetonato)zirconium, tri-isopropoxy mono(acetylacetonato)zirconium, tri-n-butoxymono(acetylacetonato)zirconium, tri-s-butoxymono(acetylacetonato)zirconium, tri-t-butoxymono(acetylacetonato)zirconium, diethoxybis(acetylacetonato)zirconium, di-n-propoxybis(acetylacetonato)zirconium, di-isopropoxybis(acetylacetonato)zirconium, di-n-butoxybis(acetylacetonato)zirconium, di-s-butoxybis(acetylacetonato)zirconium, di-t-butoxybis(acetylacetonato)zirconium, monoethoxytris(acetylacetonato)zirconium, mono-n-propoxy tris(acetylacetonato)zirconium, mono-isopropoxytris(acetylacetonato)zirconium, mono-n-butoxy tris(acetylacetonato)zirconium, mono-s-butoxytris(acetylacetonato)zirconium, mono-t-butoxy tris(acetylacetonato)zirconium, tetrakis(acetylacetonato)zirconium, triethoxymono(ethylacetoacetato)zirconium, tri-n-propoxymono(ethylacetoacetato)zirconium, tri-isopropoxymono(ethylacetoacetato)zirconium, tri-n-butoxymono(ethylacetoacetato)zirconium, tri-s-butoxymono(ethylacetoacetato)zirconium, tri-t-butoxymono(ethylacetoacetato)zirconium, diethoxybis(ethylacetoacetato)zirconium, di-n-propoxybis(ethylacetoacetato)zirconium, di-isopropoxybis(ethylacetoacetato)zirconium, di-n-butoxybis(ethylacetoacetato)zirconium, di-s-butoxybis(ethylacetoacetato)zirconium, di-t-butoxybis(ethylacetoacetato)zirconium, monoethoxytris(ethylacetoacetato)zirconium, mono-n-propoxytris(ethylacetoacetato)zirconium, mono-isopropoxytris(ethylacetoacetato)zirconium, mono-n-butoxytris(ethylacetoacetato)zirconium, mono-s-butoxytris(ethylacetoacetato)zirconium, mono-t-butoxytris(ethylacetoacetato)zirconium, tetrakis(ethylacetoacetato)zirconium, mono(acetylacetonato)tris(ethylacetoacetato)zirconium, bis(acetylacetonato)bis(ethylacetoacetato)zirconium, and tris(acetylacetonato)mono(ethylacetoacetato)zirconium; and aluminum chelate compounds, such as tris(acetylacetonato)aluminum and tris(ethylacetoacetato)aluminum.

Examples of the organic acid serving as a catalyst for the hydrolysis and condensation include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, and tartaric acid.

Examples of the inorganic acid serving as a catalyst for the hydrolysis and condensation include hydrochloric acid, nitric acid, sulfuric acid, hydrofluoric acid, and phosphoric acid.

In a preferred embodiment of the present invention, the hydrolysis condensate is produced by hydrolysis and condensation of the aforementioned hydrolyzable silane compound in the presence of nitric acid.

Examples of the organic base serving as a catalyst for the hydrolysis and condensation include, but are not limited to, pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclooctane, diazabicyclononane, diazabicycloundecene, tetramethylammonium hydroxide, tetraethylammonium hydroxide, tetrapropylammonium hydroxide, tetrabutylammonium hydroxide, trimethylphenylammonium hydroxide, benzyltrimethylammonium hydroxide, and benzyltriethylammonium hydroxide.

Examples of the inorganic base serving as a catalyst for the hydrolysis and condensation include, but are not limited to, ammonia, sodium hydroxide, potassium hydroxide, barium hydroxide, and calcium hydroxide.

Among these catalysts, a metal chelate compound, an organic acid, or an inorganic acid is preferred, and nitric acid is particularly preferred.

Generally, the hydrolysis and condensation of the hydrolyzable silane compound are performed in a solvent.

Examples of the solvent used for the hydrolysis and condensation include, but are not limited to, aliphatic hydrocarbon solvents, such as n-pentane, isopentane, n-hexane, isohexane, n-heptane, isoheptane, 2,2,4-trimethylpentane, n-octane, isooctane, cyclohexane, and methylcyclohexane; aromatic hydrocarbon solvents, such as benzene, toluene, xylene, ethylbenzene, trimethylbenzene, methylethylbenzene, n-propylbenzene, isopropylbenzene, diethylbenzene, isobutylbenzene, triethylbenzene, di-isopropylbenzene, n-amylnaphthalene, and trimethylbenzene; monohydric alcohol solvents, such as methanol, ethanol, n-propanol, isopropanol, n-butanol, isobutanol, s-butanol, t-butanol, n-pentanol, isopentanol, 2-methylbutanol, s-pentanol, t-pentanol, 3-methoxybutanol, n-hexanol, 2-methylpentanol, s-hexanol, 2-ethylbutanol, s-heptanol, heptanol-3, n-octanol, 2-ethylhexanol, s-octanol, n-nonyl alcohol, 2,6-dimethylheptanol-4, n-decanol, s-undecyl alcohol, trimethylnonyl alcohol, s-tetradecyl alcohol, s-heptadecyl alcohol, phenol, cyclohexanol, methylcyclohexanol, 3,3,5-trimethylcyclohexanol, benzyl alcohol, phenylmethylcarbinol, diacetone alcohol, and cresol; polyhydric alcohol solvents, such as ethylene glycol, propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol, and glycerin; ketone solvents, such as acetone, methyl ethyl ketone, methyl-n-propyl ketone, methyl-n-butyl ketone, diethyl ketone, methyl-isobutyl ketone, methyl-n-pentyl ketone, ethyl-n-butyl ketone, methyl-n-hexyl ketone, di-isobutyl ketone, trimethylnonanone, cyclohexanone, methylcyclohexanone, 2,4-pentanedione, acetonylacetone, diacetone alcohol, acetophenone, and fenchone; ether solvents, such as ethyl ether, isopropyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxytriglycol, tetraethylene glycol di-n-butyl ether, propylene glycol monomethyl ether, propylene glycol monoethyl ether, propylene glycol monopropyl ether, propylene glycol monobutyl ether, propylene glycol monomethyl ether acetate, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran; ester solvents, such as diethyl carbonate, methyl acetate, ethyl acetate, γ-butyrolactone, γ-valerolactone, n-propyl acetate, isopropyl acetate, n-butyl acetate, isobutyl acetate, s-butyl acetate, n-pentyl acetate, s-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents, such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents, such as dimethyl sulfide, diethyl sulfide, thiophene, tetrahydrothiophene, dimethyl sulfoxide, sulfolane, and 1,3-propanesultone. These solvents may be used alone or in combination of two or more species.

Of these, preferred are ketone solvents, such as acetone, methyl ethyl ketone, methyl-n-propyl ketone, methyl-n-butyl ketone, diethyl ketone, methyl-isobutyl ketone, methyl-n-pentyl ketone, ethyl-n-butyl ketone, methyl-n-hexyl ketone, di-isobutyl ketone, trimethylnonanone, cyclohexanone, methylcyclohexanone, 2,4-pentanedione, acetonylacetone, diacetone alcohol, acetophenone, and fenchone, from the viewpoint of the storage stability of the resultant solution.

When a silane other than the hydrolyzable silane of Formula (1) is used as a hydrolyzable silane, the amount of the hydrolyzable silane of Formula (1) added is generally 0.1% by mole or more relative to the amount of all hydrolyzable silanes. From the viewpoint of achieving the aforementioned effects of the present invention at high reproducibility, the amount of the hydrolyzable silane is preferably 0.5% by mole or more, more preferably 1% by mole or more, still more preferably 5% by mole or more.

When the hydrolyzable silane of Formula (2) is used, the amount of the silane added can be generally 99.9% by mole or less, preferably 50% by mole to 80% by mole, more preferably 60% by mole to 80% by mole, relative to the amount of all hydrolyzable silanes.

When the hydrolyzable silane of Formula (3) is used, the amount of the silane added can be generally 99.9% by mole or less, preferably 0.1% by mole to 50% by mole, more preferably 10% by mole to 30% by mole, relative to the amount of all hydrolyzable silanes.

In a preferred embodiment, the hydrolysis condensate contained in the film-forming composition of the present invention is prepared from the hydrolyzable silane of Formula (1) and an additional hydrolyzable silane. The hydrolysis condensate contains the monomer unit of the hydrolyzable silane of Formula (1) in an amount of preferably 0.1% by mole to 20% by mole, more preferably 0.1% by mole to 15% by mole, still more preferably 0.1% by mole to 10% by mole, relative to the amount of all monomer units, and also contains the monomer unit of an additional hydrolyzable silane, preferably the monomer unit of the hydrolyzable silane of Formula (2) and the monomer unit of the hydrolyzable silane of Formula (3).

In the present invention, the hydrolysis condensate generally has a weight average molecular weight of 500 to 1,000,000. From the viewpoint of, for example, preventing the precipitation of the hydrolysis condensate in the composition, the weight average molecular weight is preferably 500,000 or less, more preferably 250,000 or less, still more preferably 100,000 or less. From the viewpoint of, for example, the compatibility between storage stability and applicability, the weight average molecular weight is preferably 700 or more, more preferably 1,000 or more.

The weight average molecular weight is determined by GPC analysis in terms of polystyrene. The GPC analysis can be performed under, for example, the following conditions: GPC apparatus (trade name: HLC-8220GPC, available from Tosoh Corporation), GPC columns (trade name: Shodex KF803L, KF802, and KF801, available from Showa Denko K.K.), a column temperature of 40° C., tetrahydrofuran serving as an eluent (elution solvent), a flow amount (flow rate) of 1.0 mL/min, and polystyrene (available from Showa Denko K.K.) as a standard sample.

Under the conditions described above, the hydrolysis condensate can be produced by hydrolysis and condensation of the hydrolyzable silane compound.

After completion of the reaction, the reaction mixture is used as is, or diluted or concentrated. The resultant reaction mixture can be neutralized or treated with an ion-exchange resin, to thereby remove the acid catalyst used for the hydrolysis and condensation. Before or after such a treatment, alcohols (i.e., by-products), water, the catalyst, etc. can be removed from the reaction mixture through, for example, distillation under reduced pressure.

If necessary, the solvent can be entirely or partially evaporated from the solution containing the hydrolysis condensate after the aforementioned purification, to thereby yield the hydrolysis condensate in the form of a solid or a solution containing the hydrolysis condensate.

[Crosslinking Agent]

The film-forming composition of the present invention contains at least one crosslinking agent selected from the group consisting of an aminoplast crosslinking agent and a phenoplast crosslinking agent.

When each of the aminoplast crosslinking agent and the phenoplast crosslinking agent is exposed to high temperature during thermal curing, the crosslinking reaction proceeds between the crosslinking agent and the hydrolysis condensate used in the present invention.

The total amount of the aminoplast crosslinking agent and the phenoplast crosslinking agent contained in the film-forming composition of the present invention is generally 0.01 to 40% by mass relative to the amount of the hydrolysis condensate. From the viewpoint of achieving the effects of the present invention at high reproducibility, the lower limit of the total amount is preferably 0.05% by mass, more preferably 0.1% by mass, still more preferably 1% by mass, much more preferably 2% by mass. From the viewpoints of, for example, preventing precipitation of the crosslinking agents in the composition, and preparing a composition exhibiting excellent storage stability, the upper limit of the total amount is preferably 30% by mass, more preferably 25% by mass, still more preferably 20% by mass, much more preferably 15% by mass.

No particular limitation is imposed on the aminoplast crosslinking agent, so long as it has two or more methoxymethylene groups in one molecule. Examples of the aminoplast crosslinking agent include compounds of Formulae (A-1) to (A-10) described below. Typical examples of the aminoplast crosslinking agent include 1,3,4,6-tetrakis (methoxymethyl)tetrahydroimidazo[4,5-d]imidazole-2,5 (1H,3H)-dione (A-1). Other examples of the aminoplast crosslinking agent include compounds, such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, and butoxymethylated thiourea.

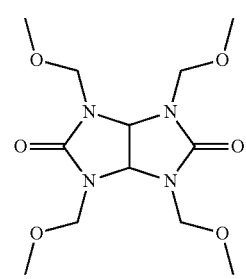

(A-1)

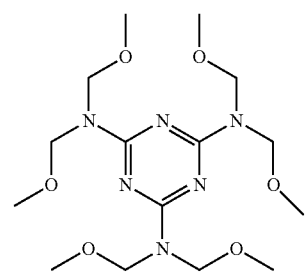

(A-2)

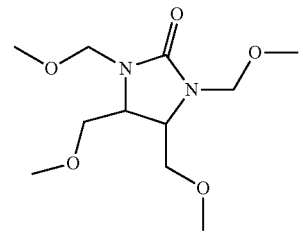

(A-3)

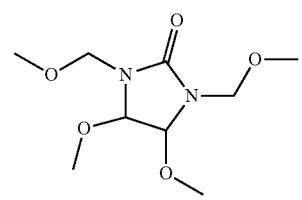

(A-4)

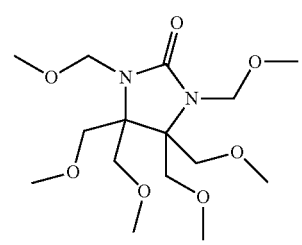

(A-5)

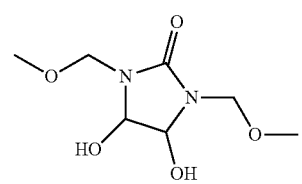

(A-6)

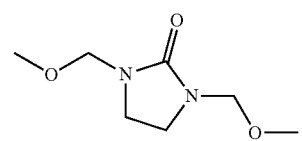

(A-7)

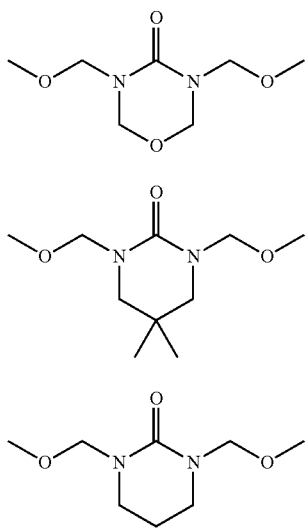
No particular limitation is imposed on the phenoplast crosslinking agent, so long as it has two or more hydroxymethylene groups in one molecule. Examples of the phenoplast crosslinking agent include compounds of Formulae (B-1) to (B-32) described below. Typical examples of the phenoplast crosslinking agent include 3,3',5,5'-tetrakis(methoxymethyl)-[1,1'-biphenyl]-4,4'-diol (B-24).
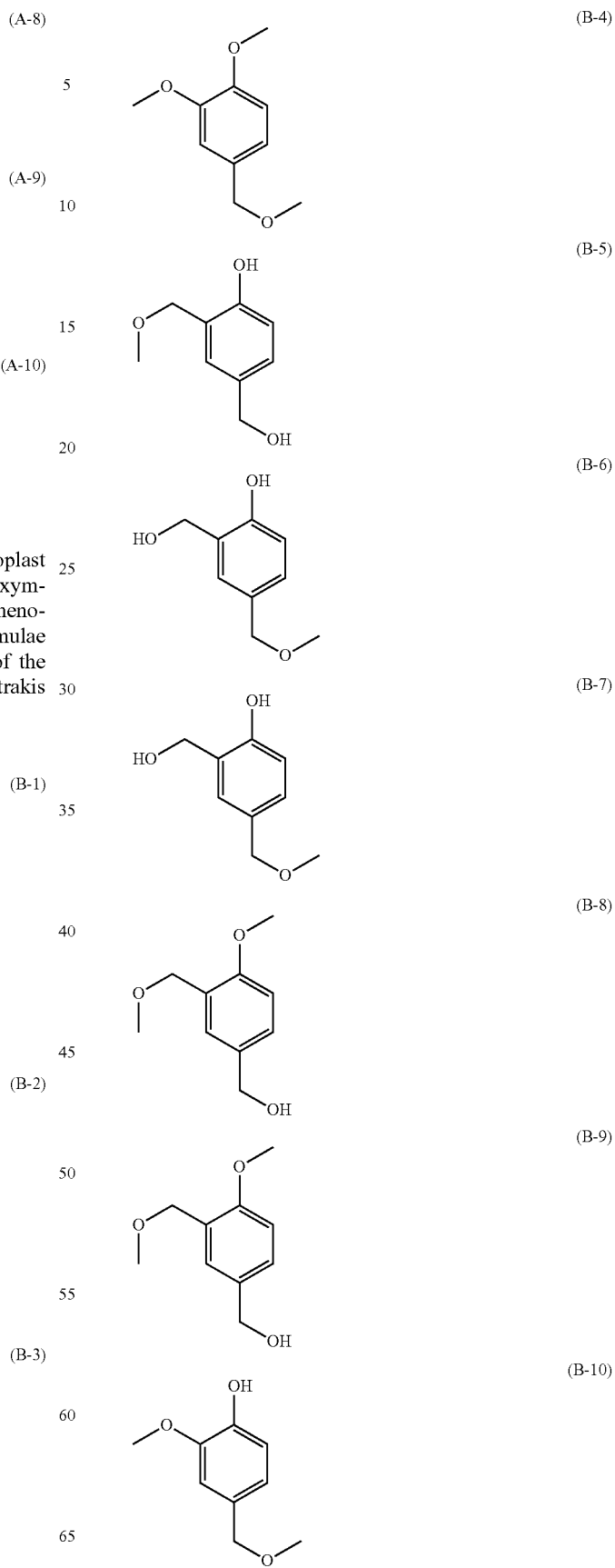

(B-11) 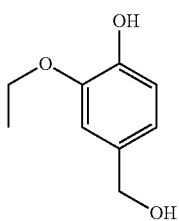
(B-12) 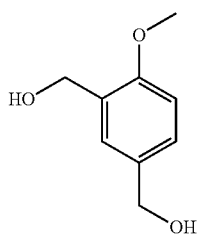
(B-13) 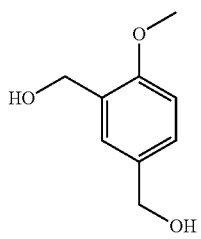
(B-14) 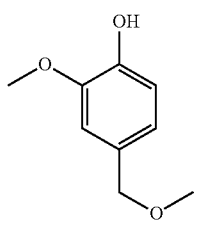
(B-15) 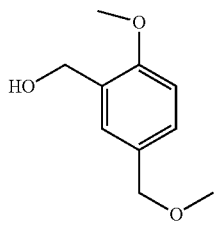
(B-16) 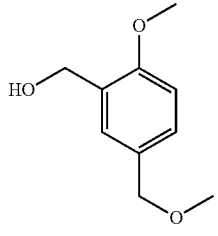
(B-17) 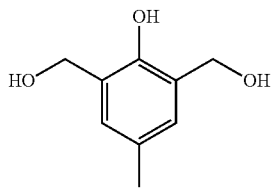
(B-18) 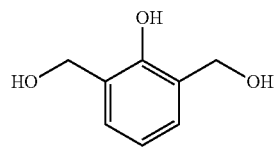
(B-19) 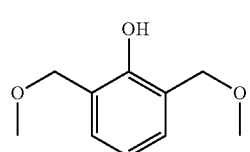
(B-20) 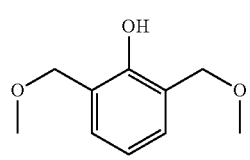
(B-21) 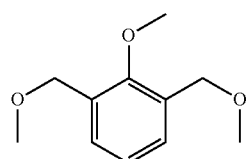
(B-22) 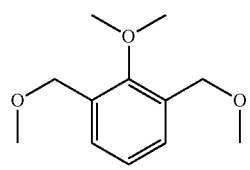
(B-23) 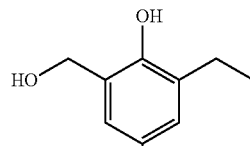
(B-24) 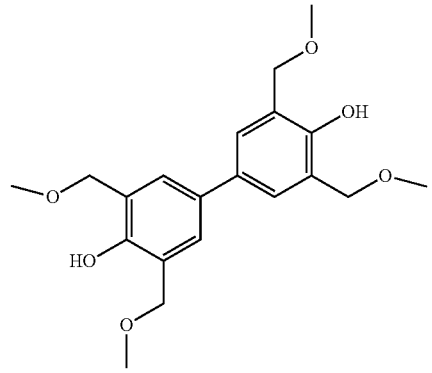

(B-25)
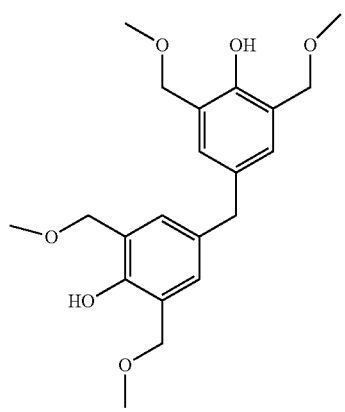
(B-26)
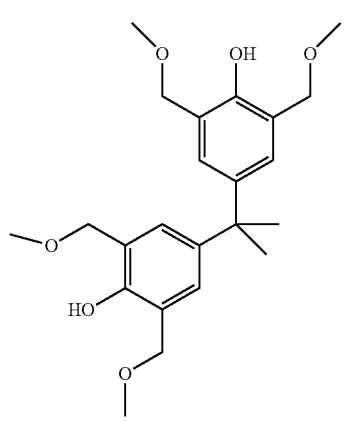
(B-27)
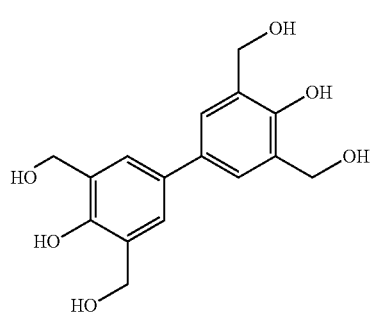
(B-28)
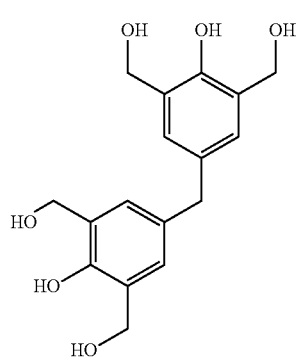
(B-29)
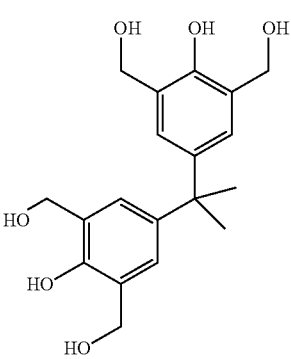
(B-30)
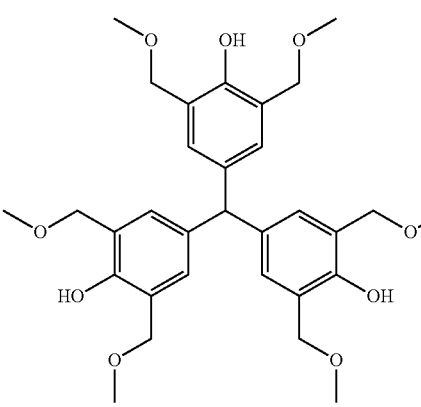
(B-31)
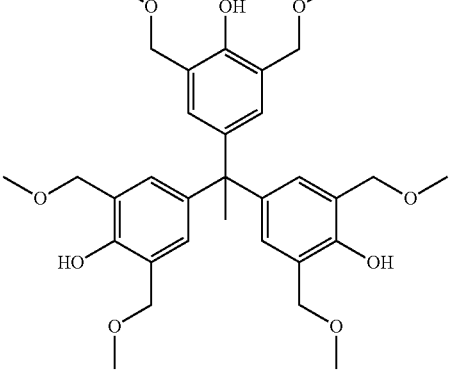
(B-32)
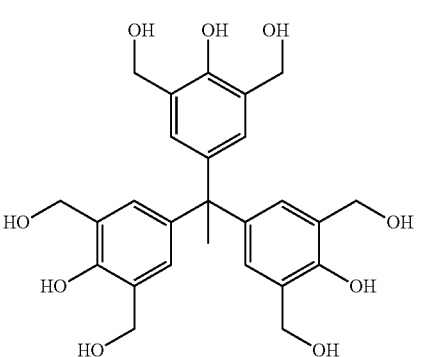
[Solvent]
The film-forming composition of the present invention contains a solvent.
No particular limitation is imposed on the solvent, so long as it dissolves a solid content. As used herein, the "solid content" of the composition refers to all components (except for the solvent) contained in the composition.

Specific examples of the solvent used in the present invention include methylcellosolve acetate, ethylcellosolve acetate, propylene glycol, propylene glycol monomethyl ether, propylene glycol monoethyl ether, methyl isobutyl carbinol, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropinoate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol mooethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether, propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, ethyl hydroxyacetate, ethyl 2-hydroxy-2-methylpropionate, methyl 3-methoxy-2-methylpropionate, methyl 2-hydroxy-3-methybutyrate, ethyl methoxyacetate, ethyl ethoxyacetate, methyl 3-methoxypropionate, ethyl 3-ethoxypropionate, ethyl 3-methoxypropionate, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, methyl acetoacetate, toluene, xylene, methyl ethyl ketone, methyl propyl ketone, methyl butyl ketone, 2-heptanone, 3-heptanone, 4-heptanone, cyclohexanone, N,N-dimethylformamide, N-methylacetamide, N,N-dimethylacetamide, N-methylpyrrolidone, 4-methyl-2-pentanol, and γ-butyrolactone. These solvents may be used alone or in combination of two or more species.

The film-forming composition of the present invention may contain water as a solvent. The amount of water is generally 30% by mass or less, preferably 20% by mass or less, more preferably 15% by mass or less, relative to the solvents contained in the composition.

[Acid Catalyst]

The film-forming composition of the present invention may contain an acid generator as an acid catalyst. Incorporation of such an acid catalyst enables efficient progress of crosslinking between the hydrolysis condensate and an aminoplast crosslinking agent or a phenoplast crosslinking agent. Consequently, pattern collapse can be prevented at higher reproducibility.

Examples of the acid generator include a thermal acid generator and a photoacid generator.

The thermal acid generator generates an acid during heating of the film-forming composition, whereas the photoacid generator generates an acid during light exposure of the film-forming composition. Thus, the acid generator does not generate an acid during storage of the film-forming composition, and enhances the storage stability of the composition. In addition, the acid generator can accelerate curing of a film during film formation.

Examples of the thermal acid generator contained in the film-forming composition of the present invention include, but are not limited to, 2,4,4,6-tetrabromocyclohexadienone, benzoin tosylate, 2-nitrobenzyl tosylate, and other organic sulfonic acid alkyl esters.

Examples of the photoacid generator include, but are not limited to, an onium salt compound, a sulfonimide compound, and a disulfonyldiazomethane compound.

Specific examples of the onium salt compound include, but are not limited to, iodonium salt compounds, such as diphenyliodonium hexafluorophosphate, diphenyliodonium trifluoromethanesulfonate, diphenyliodonium nonafluoro normal butanesulfonate, diphenyliodonium perfluoro normal octanesulfonate, diphenyliodonium camphorsulfonate, bis(4-t-butylphenyl)iodonium camphorsulfonate, and bis(4-t-butylphenyl)iodonium trifluoromethanesulfonate; and sulfonium salt compounds, such as triphenylsulfonium hexafluoroantimonate, triphenylsulfonium nonafluoro normal butanesulfonate, triphenylsulfonium camphorsulfonate, triphenylsulfonium trifluoromethanesulfonate, tris(4-hydroxyphenyl)sulfonium trifluoromethanesulfonate (tris(4-hydroxyphenyl)sulfonium trifluoromethanesulfonic acid salt), and triphenylsulfonium trifluoromethanesulfonate (triphenylsulfonium trifluoromethanesulfonic acid salt).

Specific examples of the sulfonimide compound include, but are not limited to, N-(trifluoromethanesulfonyloxy)succinimide, N-(nonafluoro normal butane sulfonyloxy)succinimide, N-(camphorsulfonyloxy)succinimide, and N-(trifluoromethanesulfonyloxy)naphthalimide.

Specific examples of the disulfonyldiazomethane compound include, but are not limited to, bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

These acid generators may be used alone or in combination of two or more species. Thus, a single photoacid generator may be used, or two or more photoacid generators may be used in combination. Also, a single thermal acid generator may be used, or two or more thermal acid generators may be used in combination. Alternatively, a photoacid generator and a thermal acid generator may be used in combination.

Among these, any of the following photoacid generators is preferred.

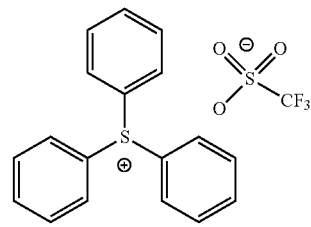

(P-1)

-continued

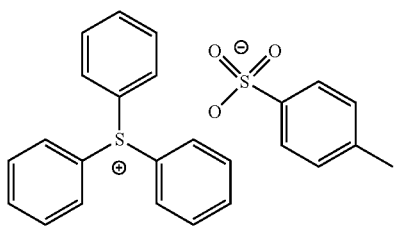
(P-2)

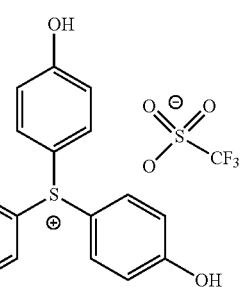
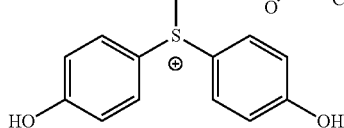
(P-3)

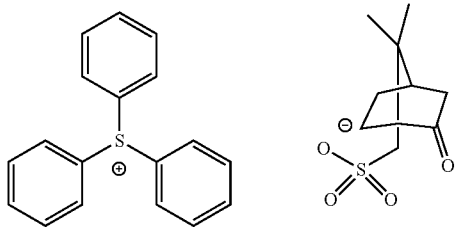
(P-4)

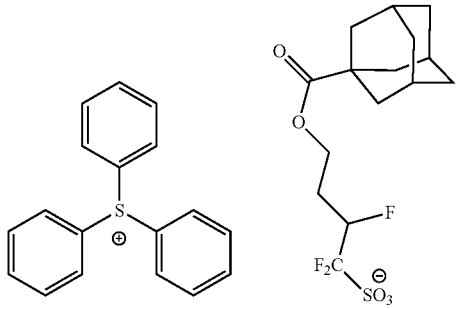
(P-5)

When the film-forming composition of the present invention contains an acid generator, the amount of the acid generator cannot be univocally determined, since the amount should be appropriately determined in consideration of, for example, the type of the acid generator. The amount of the acid generator is generally 0.01% by mass to 5% by mass relative to the mass of the hydrolysis condensate of the hydrolyzable silane compound. From the viewpoint of, for example, preventing the precipitation of the acid generator in the composition, the amount is preferably 3% by mass or less, more preferably 1% by mass or less. From the viewpoint of, for example, sufficiently achieving the effect of the acid generator, the amount is preferably 0.1% by mass or more, more preferably 0.5% by mass or more.

[Curing Catalyst]

The film-forming composition of the present invention may contain a curing catalyst. The curing catalyst is used for causing OH groups remaining in the hydrolysis condensate to react in the hydrolysis condensate, between molecules of the hydrolysis condensate, or between the hydrolysis condensate and the hydrolysate, to thereby convert the OH groups into Si—O—Si bonds. Incorporation of the curing catalyst into the film-forming composition of the present invention can achieve prevention of pattern collapse at higher reproducibility.

The curing catalyst may also serve as an acid catalyst.

The curing catalyst may be an ammonium salt, a phosphine compound, a phosphonium salt, or a sulfonium salt.

Examples of the ammonium salt include:

a quaternary ammonium salt having a structure of the following Formula (D-1):

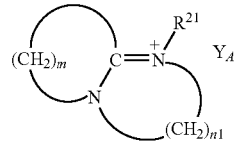

Formula (D-1)

(wherein m is an integer of 2 to 11; $n_1$ is an integer of 2 or 3; $R^{21}$ is an alkyl group or an aryl group; and $Y_A^-$ is an anion);

a quaternary ammonium salt having a structure of the following Formula (D-2):

$$R^{22}R^{23}R^{24}R^{25}N^+Y_A^-$$ Formula (D-2)

(wherein $R^{22}$, $R^{23}$, $R^{24}$, and $R^{25}$ are each an alkyl group or an aryl group; N is a nitrogen atom; $Y_A^-$ is an anion; and each of $R^{22}$, $R^{23}$, $R^{24}$, and $R^{25}$ is bonded to the nitrogen atom via a C—N bond);

a quaternary ammonium salt having a structure of the following Formula (D-3):

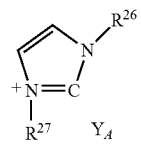

Formula (D-3)

(wherein $R^{26}$ and $R^{27}$ are each an alkyl group or an aryl group; and $Y_A^-$ is an anion);

a quaternary ammonium salt having a structure of the following Formula (D-4):

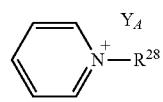

Formula (D-4)

(wherein $R^{28}$ is an alkyl group or an aryl group; and $Y_A^-$ is an anion);

a quaternary ammonium salt having a structure of the following Formula (D-5):

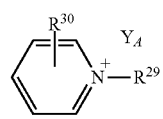

Formula (D-5)

(wherein $R^{29}$ and $R^{30}$ are each an alkyl group or an aryl group; and $Y_A^-$ is an anion); and a tertiary ammonium salt having a structure of the following Formula (D-6):

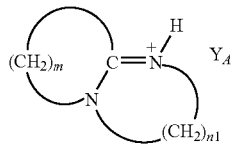

Formula (D-6)

(wherein m is an integer of 2 to 11; $n_1$ is an integer of 2 or 3; H is a hydrogen atom; and $Y_A^-$ is an anion).

Examples of the phosphonium salt include a quaternary phosphonium salt of the following Formula (D-7):

Formula (D-7)

(wherein $R^{31}$, $R^{32}$, $R^{33}$, and $R^{34}$ are each an alkyl group or an aryl group; P is a phosphorus atom; $Y_A^-$ is an anion; and each of $R^{31}$, $R^{32}$, $R^{33}$, and $R^{34}$ is bonded to the phosphorus atom via a C—P bond).

Examples of the sulfonium salt include a tertiary sulfonium salt of the following Formula (D-8):

Formula (D-8)

(wherein $R^{35}$, $R^{36}$, and $R^{37}$ are each an alkyl group or an aryl group; S is a sulfur atom; $Y_A^-$ is an anion; and each of $R^{35}$, $R^{36}$, and $R^{37}$ is bonded to the sulfur atom via a C—S bond).

The compound of Formula (D-1) is a quaternary ammonium salt derived from an amine. In Formula (D-1), m is an integer of 2 to 11, and $n_1$ is an integer of 2 or 3. $R^{21}$ of the quaternary ammonium salt is a $C_{1-18}$ alkyl or aryl group, preferably a $C_{2-10}$ alkyl or aryl group. Examples thereof include linear alkyl groups, such as ethyl group, propyl group, and butyl group, benzyl group, cyclohexyl group, cyclohexylmethyl group, and dicyclopentadienyl group. Examples of the anion ($Y_A^-$) include halogen ions, such as chlorine ion (Cl⁻), bromine ion (Br⁻), and iodine ion (I⁻); and acid groups, such as carboxylate (—COO⁻), sulfonate (—SO₃⁻), and alcoholate (—O⁻).

The compound of Formula (D-2) is a quaternary ammonium salt having a structure of $R^{22}R^{23}R^{24}R^{25}N^+Y_A^-$. $R^{22}$, $R^{23}$, $R^{24}$, and $R^{25}$ of the quaternary ammonium salt are each a $C_{1-18}$ alkyl or aryl group. Examples thereof include linear alkyl groups, such as ethyl group, propyl group, and butyl group, benzyl group, cyclohexyl group, cyclohexylmethyl group, and dicyclopentadienyl group. Examples of the anion ($Y_A^-$) include halogen ions, such as chlorine ion (Cl⁻), bromine ion (Br⁻), and iodine ion (I⁻); and acid groups, such as carboxylate (—COO⁻), sulfonate (—SO₃⁻), and alcoholate (—O⁻). The quaternary ammonium salt is commercially available, and examples of the quaternary ammonium salt include tetramethylammonium acetate, tetrabutylammonium acetate, triethylbenzylammonium chloride, triethylbenzylammonium bromide, trioctylmethylammonium chloride, tributylbenzylammonium chloride, and trimethylbenzylammonium chloride.

The compound of Formula (D-3) is a quaternary ammonium salt derived from 1-substituted imidazole. In Formula (D-3), $R^{26}$ and $R^{27}$ are each a $C_{1-18}$ alkyl or aryl group, and the total number of carbon atoms of $R^{26}$ and $R^{27}$ is preferably 7 or more. Examples of $R^{26}$ include methyl group, ethyl group, propyl group, phenyl group, and benzyl group. Examples of $R^{27}$ include benzyl group, octyl group, and octadecyl group. Examples of the anion ($Y_A^-$) include halogen ions, such as chlorine ion (Cl⁻), bromine ion (Br⁻), and iodine ion (I⁻); and acid groups, such as carboxylate (—COO⁻), sulfonate (—SO₃⁻), and alcoholate (—O⁻). Although this compound is commercially available, the compound may be produced through, for example, reaction between an imidazole compound (e.g., 1-methylimidazole or 1-benzylimidazole) and an aralkyl halide, an alkyl halide, or an aryl halide (e.g., benzyl bromide, methyl bromide, or benzene bromide).

The compound of Formula (D-4) is a quaternary ammonium salt derived from pyridine. In Formula (D-4), $R^{28}$ is a $C_{1-18}$ alkyl or aryl group, preferably a $C_{4-18}$ alkyl or aryl group. Examples thereof include butyl group, octyl group, benzyl group, and lauryl group. Examples of the anion ($Y_A^-$) include halogen ions, such as chlorine ion (Cl⁻), bromine ion (Br⁻), and iodine ion (I⁻); and acid groups, such as carboxylate (—COO⁻), sulfonate (—SO₃⁻), and alcoholate (—O⁻). Although this compound is commercially available, the compound may be produced through, for example, reaction between pyridine and an alkyl halide or an aryl halide, such as lauryl chloride, benzyl chloride, benzyl bromide, methyl bromide, or octyl bromide. Examples of this compound include N-laurylpyridinium chloride and N-benzylpyridinium bromide.

The compound of Formula (D-5) is a quaternary ammonium salt derived from a substituted pyridine, such as picoline. In Formula (D-5), $R^{29}$ is a $C_{1-18}$ alkyl or aryl group, preferably a $C_{4-18}$ alkyl or aryl group. Examples thereof include methyl group, octyl group, lauryl group, and benzyl group. $R^{30}$ is a $C_{1-18}$ alkyl or aryl group, and, for example, $R^{30}$ is a methyl group when the compound of Formula (D-5) is a quaternary ammonium salt derived from picoline. Examples of the anion ($Y_A^-$) include halogen ions, such as chlorine ion (Cl⁻), bromine ion (Br⁻), and iodine ion (I⁻); and acid groups, such as carboxylate (—COO⁻), sulfonate (—SO₃⁻), and alcoholate (—O⁻). Although this compound is commercially available, the compound may be produced through, for example, reaction between a substituted pyridine (e.g., picoline) and an alkyl halide or an aryl halide, such as methyl bromide, octyl bromide, lauryl chloride, benzyl chloride, or benzyl bromide. Examples of this compound include N-benzylpicolinium chloride, N-benzylpicolinium bromide, and N-laurylpicolinium chloride.

The compound of Formula (D-6) is a tertiary ammonium salt derived from an amine. In Formula (D-6), m is an integer of 2 to 11, and $n_1$ is an integer of 2 or 3. Examples of the anion ($Y_A^-$) include halogen ions, such as chlorine ion (Cl⁻), bromine ion (Br⁻), and iodine ion (I⁻); and acid groups, such as carboxylate (—COO⁻), sulfonate (—SO₃⁻), and alcoholate (—O⁻). The compound may be produced through, for example, reaction between an amine and a weak acid, such as a carboxylic acid or phenol. Examples of the carboxylic acid include formic acid and acetic acid. When formic acid is used, the anion ($Y_A^-$) is (HCOO⁻). When acetic acid is used, the anion ($Y_A^-$) is (CH₃COO⁻). When phenol is used, the anion ($Y_A^-$) is (C₆H₅O⁻).

The compound of Formula (D-7) is a quaternary phosphonium salt having a structure of $R^{31}R^{32}R^{33}R^{34}P^+Y_A^-$. $R^{31}$, $R^{32}$, $R^{33}$, and $R^{34}$ are each a $C_{1-18}$ alkyl or aryl group. Examples thereof include linear alkyl groups, such as ethyl group, propyl group, and butyl group, benzyl group, cyclohexyl group, cyclohexylmethyl group, and dicyclopentadienyl group. Three of the four substituents $R^{31}$ to $R^{34}$ are preferably an unsubstituted phenyl group or a substituted phenyl group, such as a phenyl group or a tolyl group. The remaining one substituent is a $C_{1-18}$ alkyl or aryl group. Examples of the anion ($Y_A^-$) include halogen ions, such as chlorine ion (Cl⁻), bromine ion (Br⁻), and iodine ion (I⁻);

and acid groups, such as carboxylate (—COO⁻), sulfonate (—SO₃⁻), and alcoholate (—O⁻). This compound is commercially available, and examples of the compound include tetraalkylphosphonium halides, such as tetra-n-butylphosphonium halides and tetra-n-propylphosphonium halides; trialkylbenzylphosphonium halides, such as triethylbenzylphosphonium halides; triphenylmonoalkylphosphonium halides, such as triphenylmethylphosphonium halides and triphenylethylphosphonium halides; triphenylbenzylphosphonium halides; tetraphenylphosphonium halides; tritolylmonoarylphosphonium halides; or tritolylmonoalkylphosphonium halides (wherein the halogen atom is a chlorine atom or a bromine atom). Particularly preferred are triphenylmonoalkylphosphonium halides, such as triphenylmethylphosphonium halides and triphenylethylphosphonium halides; triphenylmonoarylphosphonium halides, such as triphenylbenzylphosphonium halides; tritolylmonoarylphosphonium halides, such as tritolylmonophenylphosphonium halides; and tritolylmonoalkylphosphonium halides, such as tritolylmonomethylphosphonium halides (wherein the halogen atom is a chlorine atom or a bromine atom).

Examples of the phosphine compound include primary phosphines, such as methylphosphine, ethylphosphine, propylphosphine, isopropylphosphine, isobutylphosphine, and phenylphosphine; secondary phosphines, such as dimethylphosphine, diethylphosphine, diisopropylphosphine, diisoamylphosphine, and diphenylphosphine; and tertiary phosphines, such as trimethylphosphine, triethylphosphine, triphenylphosphine, methyldiphenylphosphine, and dimethylphenylphosphine.

The compound of Formula (D-8) is a tertiary sulfonium salt having a structure of $R^{35}R^{36}R^{37}S^+Y_A^-$. $R^{35}$, $R^{36}$, and $R^{37}$ are each a $C_{1-18}$ alkyl or aryl group. Examples thereof include linear alkyl groups, such as ethyl group, propyl group, and butyl group, benzyl group, cyclohexyl group, cyclohexylmethyl group, and dicyclopentadienyl group. Three of the four substituents $R^{35}$ to $R^{37}$ are preferably a phenyl group or a substituted phenyl group, such as a phenyl group or a tolyl group. The remaining one substituent is a $C_{1-18}$ alkyl or aryl group. Examples of the anion ($Y_A^-$) include halogen ions, such as chlorine ion (Cl⁻), bromine ion (Br⁻), and iodine ion (I⁻); and acid groups, such as carboxylate (—COO⁻), sulfonate (—SO₃⁻), alcoholate (—O⁻), maleate anion, and nitrate anion.

This compound is commercially available, and examples of the compound include tetraalkylsulfonium halides, such as tri-n-butylsulfonium halides and tri-n-propylsulfonium halides; trialkylbenzylsulfonium halides, such as diethylbenzylsulfonium halides; diphenylmonoalkylsulfonium halides, such as diphenylmethylsulfonium halides and diphenylethylsulfonium halides; triphenylsulfonium halides (wherein the halogen atom is a chlorine atom or a bromine atom); tetraalkylphosphonium carboxylates, such as tri-n-butylsulfonium carboxylate and tri-n-propylsulfonium carboxylate; trialkylbenzylsulfonium carboxylates, such as diethylbenzylsulfonium carboxylate; diphenylmonoalkylsulfonium carboxylates, such as diphenylmethylsulfonium carboxylate and diphenylethylsulfonium carboxylate; and triphenylsulfonium carboxylate. Triphenylsulfonium halides and triphenylsulfonium carboxylate are preferably used.

In the present invention, a nitrogen-containing silane compound can be added as a curing catalyst. Examples of the nitrogen-containing silane compound include silane compounds containing an imidazole ring, such as N-(3-triethoxysilylpropyl)-4,5-dihydroimidazole.

Among the aforementioned curing catalysts, preferred are sulfonium salt compounds, such as triphenylsulfonium adamantanecarboxylate trifluoroethanesulfonate (sulfonic acid salt), triphenylsulfonium p-toluenesulfonate (sulfonic acid salt), triphenylsulfonium methanesulfonate (sulfonic acid salt), triphenylsulfonium phenolsulfonate (sulfonic acid salt), triphenylsulfonium nitrate (nitric acid salt), triphenylsulfonium maleate, bis(triphenylsulfonium) maleate, triphenylsulfonium hydrochloride, triphenylsulfonium acetate, triphenylsulfonium trifluoroacetate, triphenylsulfonium salicylate, triphenylsulfonium benzoate, and triphenylsulfonium hydroxide, and particularly preferred is triphenylsulfonium nitrate.

The amount of the curing catalyst is 0.01 to 10 parts by mass, or 0.01 to 5 parts by mass, or 0.01 to 3 parts by mass relative to 100 parts by mass of the polyorganosiloxane.

[Stabilizer]

The film-forming composition of the present invention may contain an organic acid, water, an alcohol, etc. for the purpose of, for example, stabilization of the hydrolysis condensate contained in the film-forming composition.

Specific examples of the organic acid that may be contained in the film-forming composition of the present invention for the aforementioned purpose include, but are not limited to, oxalic acid, malonic acid, methylmalonic acid, succinic acid, maleic acid, malic acid, tartaric acid, phthalic acid, citric acid, glutaric acid, citric acid, lactic acid, and salicylic acid. Of these, oxalic acid or maleic acid is preferred.

When the film-forming composition of the present invention contains an organic acid, the amount of the organic acid is 0.1% by mass to 5.0% by mass relative to the total mass of the hydrolysis condensate.

Examples of the water that may be contained in the film-forming composition of the present invention for the aforementioned purpose include pure water, ultrapure water, and ion-exchange water.

When the film-forming composition of the present invention contains water, the amount of the water may be 1 to 20 parts by mass relative to 100 parts by mass of the film-forming composition. Water may serve as both a stabilizer and a solvent.

The alcohol that may be contained in the film-forming composition of the present invention for the aforementioned purpose is preferably an alcohol that easily evaporates by heating after the application of the composition. Specific examples of the alcohol include lower aliphatic alcohols, such as methanol, ethanol, propanol, isopropanol, and butanol.

When the film-forming composition of the present invention contains an alcohol, the amount of the alcohol is 1 part by mass to 20 parts by mass relative to 100 parts by mass of the film-forming composition. The alcohol may serve as both a stabilizer and a solvent.

[pH Adjuster]

If necessary, the film-forming composition of the present invention may contain a pH adjuster. The pH adjuster that may be added in the composition is bisphenol S or a bisphenol S derivative. The amount of bisphenol S or a bisphenol S derivative is 0.01 parts by mass to 20 parts by mass, or 0.01 parts by mass to 10 parts by mass, or 0.01 parts by mass to 5 parts by mass, relative to 100 parts by mass of the hydrolysis condensate.

Specific examples of the bisphenol S or the bisphenol S derivative include, but are not limited to, compounds of Formulae (C-1) to (C-23) described below.

Formula (C-1)
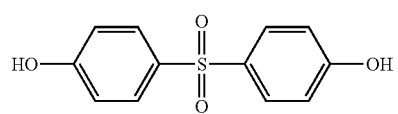
Formula (C-2)
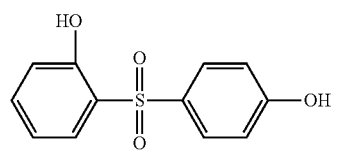
Formula (C-3)
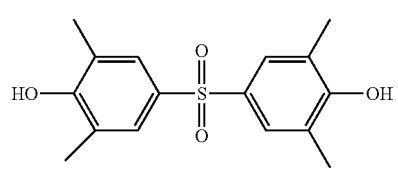
Formula (C-4)
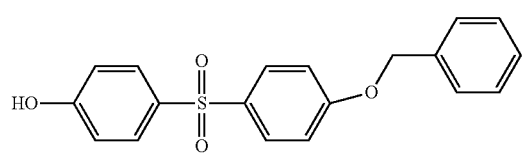
Formula (C-5)
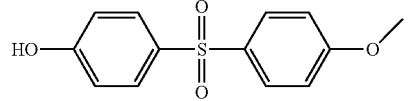
Formula (C-6)
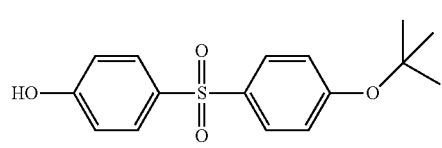
Formula (C-7)
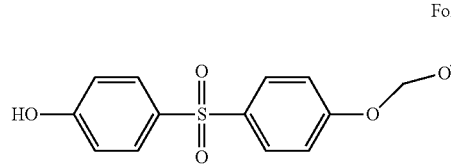
Formula (C-8)
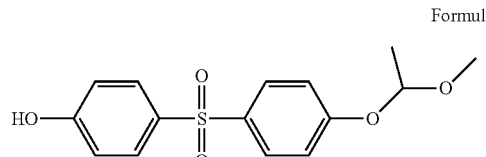
Formula (C-9)
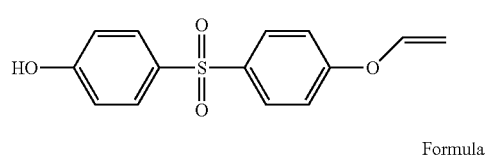
Formula (C-10)
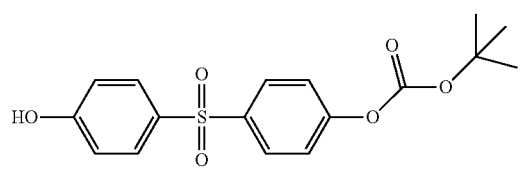
-continued
Formula (C-11)
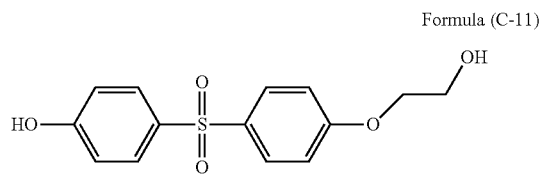
Formula (C-12)
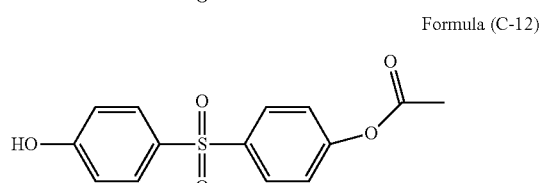
Formula (C-13)
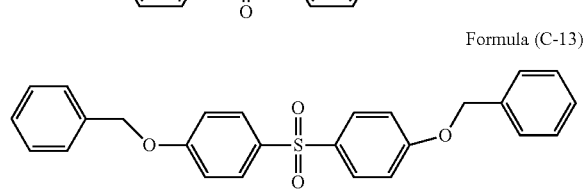
Formula (C-14)
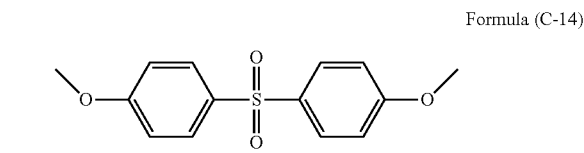
Formula (C-15)
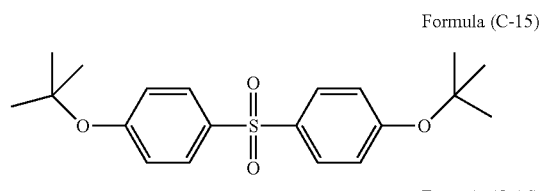
Formula (C-16)
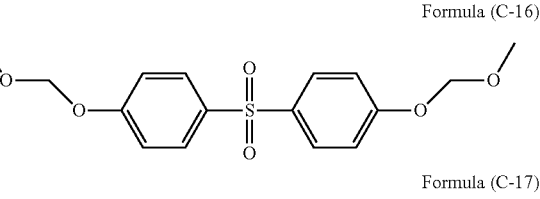
Formula (C-17)
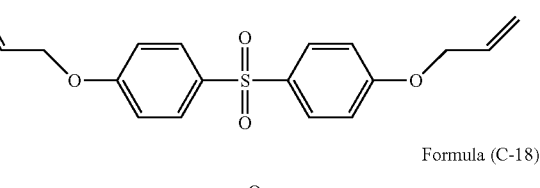
Formula (C-18)
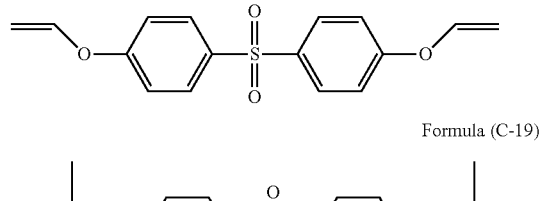
Formula (C-19)
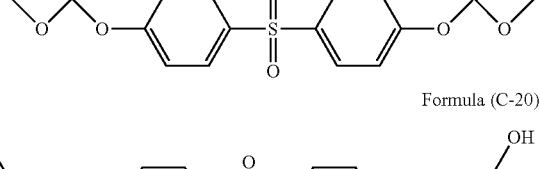
Formula (C-20)
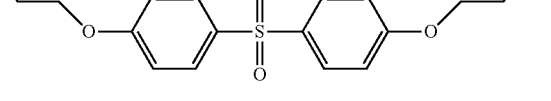

-continued

Formula (C-21)
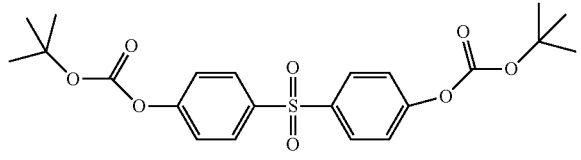

Formula (C-22)
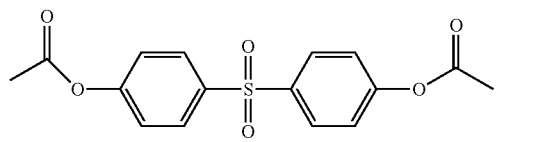

Formula (C-23)
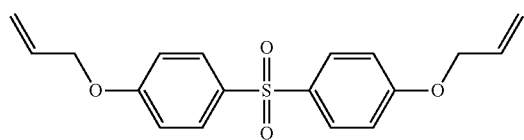

[Surfactant]

If necessary, the film-forming composition of the present invention may contain a surfactant.

When the film-forming composition of the present invention is used as a resist underlayer film-forming composition for lithography, the surfactant particularly effectively prevents formation of, for example, pinholes and striations during application of the composition to a substrate.

Specific examples of the surfactant include, but are not limited to, nonionic surfactants, for example, polyoxyethylene alkyl ethers, such as polyoxyethylene lauryl ether, polyoxyethylene stearyl ether, polyoxyethylene cetyl ether, and polyoxyethylene oleyl ether, polyoxyethylene alkylallyl ethers, such as polyoxyethylene octylphenol ether and polyoxyethylene nonylphenol ether, polyoxyethylene-polyoxypropylene block copolymers, sorbitan fatty acid esters, such as sorbitan monolaurate, sorbitan monopalmitate, sorbitan monostearate, sorbitan monooleate, sorbitan trioleate, and sorbitan tristearate, polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine-containing surfactants, such as trade names EFTOP EF301, EF303, and EF352 (available from Tohkem Products Corporation), trade names MEGAFAC F171, F173, R-08, R-30, R-30N, and R-40LM (available from DIC Corporation), Fluorad FC430 and FC431 (available from Sumitomo 3M Limited), trade name Asahi Guard AG710 and trade names SURFLON S-382, SC101, SC102, SC103, SC104, SC105, and SC106 (available from AGC Inc.); and Organosiloxane Polymer KP341 (available from Shin-Etsu Chemical Co., Ltd.).

These surfactants may be used alone or in combination of two or more species.

When the film-forming composition of the present invention contains a surfactant, the amount of the surfactant is generally 0.0001 parts by mass to 5 parts by mass relative to 100 parts by mass of the hydrolysis condensate. From the viewpoint of, for example, preventing the precipitation of the surfactant in the composition, the amount is preferably 1 part by mass or less. From the viewpoint of, for example, sufficiently achieving the effect of the surfactant, the amount is preferably 0.001 parts by mass or more, more preferably 0.01 parts by mass or more.

The film-forming composition of the present invention may further contain a rheology controlling agent, an adhesion aid, etc. The rheology controlling agent effectively improves the fluidity of the film-forming composition. The adhesion aid effectively improves the adhesion between a resist underlayer film formed from the film-forming composition of the present invention and an organic underlayer film, a semiconductor substrate, or a resist.

The film-forming composition of the present invention can be produced by mixing of the aforementioned hydrolysis condensate of the hydrolyzable silane, at least one selected from the group consisting of an aminoplast crosslinking agent and a phenoplast crosslinking agent, a solvent, and an additional component (if incorporated). In this case, a solution containing the hydrolysis condensate, etc. may be previously prepared, and the solution may be mixed with a solvent and an additional component.

No particular limitation is imposed on the order of mixing of these components. For example, a solvent may be added to and mixed with a solution containing the hydrolysis condensate, etc., and an additional component may be added to the resultant mixture. Alternatively, a solution containing the hydrolysis condensate, etc., a solvent, and an additional component may be mixed simultaneously.

If necessary, an additional solvent may be finally added, or some components that can be relatively easily dissolved in a solvent may be finally added without being incorporated into the mixture. However, from the viewpoint of preventing aggregation or separation of components to prepare a highly homogeneous composition with high reproducibility, the composition is preferably produced from a previously prepared solution containing the well-dissolved hydrolysis condensate, etc. It should be noted that the hydrolysis condensate, etc. may be aggregated or precipitated when mixed with a solvent or an additional component, depending on, for example, the type or amount of the solvent or the amount or nature of the component. It should also be noted that when a composition is prepared from a solution containing the hydrolysis condensate, etc., the concentration of the solution of the hydrolysis condensate, etc. or the amount of the solution used must be determined so as to achieve a desired amount of the hydrolysis condensate, etc. contained in the finally produced composition.

During preparation of the composition, the composition may be appropriately heated so long as the components are not decomposed or denatured.

In the present invention, the film-forming composition may be filtered with, for example, a submicrometer-order filter during production of the composition or after mixing of all the components.

The concentration of the solid content in the film-forming composition of the present invention is generally 0.1% by mass to 50% by mass relative to the mass of the composition. From the viewpoint of, for example, preventing the precipitation of the solid content, the concentration is preferably 30% by mass or less, more preferably 25% by mass or less.

The amount of the hydrolysis condensate contained in the hydrolyzable silane compound in the solid content is generally 50% by mass or more, preferably 60% by mass or more, more preferably 70% by mass or more, still more preferably 80% by mass or more, much more preferably 90% by mass or more, from the viewpoint of achieving the aforementioned effects of the present invention at high reproducibility.

The film-forming composition of the present invention can be suitably used as a resist underlayer film-forming composition for a lithographic process including a negative development process.

In one embodiment of the present invention, the resist underlayer film-forming composition (composed of the film-forming composition of the present invention) is applied onto a substrate used for the production of a semiconductor device (e.g., a silicon wafer substrate, a silicon/silicon dioxide-coated substrate, a silicon nitride substrate, a glass substrate, an ITO substrate, a polyimide substrate, or a substrate coated with a low dielectric constant material (low-k material)) by an appropriate application method with, for example, a spinner or a coater, followed by baking of the composition, to thereby form the resist underlayer film of the present invention.

Generally, the baking is performed under appropriately determined conditions; i.e., a baking temperature of 80° C. to 250° C. and a baking time of 0.3 minutes to 60 minutes. Preferably, the baking temperature is 150° C. to 250° C., and the baking time is 0.5 minutes to 2 minutes.

The resist underlayer film of the present invention may further contain a metal oxide.

Examples of such a metal oxide include, but are not limited to, oxides of a combination of one or more selected from among metals, such as tin (Sn), titanium (Ti), aluminum (Al), zirconium (Zr), zinc (Zn), niobium (Nb), tantalum (Ta), and W (tungsten), and semimetals, such as boron (B), silicon (Si), germanium (Ge), arsenic (As), antimony (Sb), and tellurium (Te).

The resist underlayer film of the present invention has a thickness of, for example, 10 nm to 1,000 nm, or 20 nm to 500 nm, or 50 nm to 300 nm, or 100 nm to 200 nm.

Subsequently, for example, a photoresist film is formed on the resist underlayer film of the present invention. The photoresist film can be formed by a well-known method; i.e., application of a photoresist composition onto the resist underlayer film of the present invention, and then baking of the composition. The photoresist film has a thickness of, for example, 50 nm to 10,000 nm, or 100 nm to 2,000 nm, or 200 nm to 1,000 nm.

In another embodiment of the present invention, an organic underlayer film can be formed on the substrate, followed by formation of the resist underlayer film of the present invention on the organic underlayer film, and then formation of a photoresist film on the resist underlayer film. The pattern width of the photoresist film can be narrowed through this process. Thus, even when the photoresist film is formed thinly for preventing pattern collapse, the substrate can be processed through selection of an appropriate etching gas. For example, the resist underlayer film of the present invention can be processed by using, as an etching gas, a fluorine-containing gas that achieves a significantly high etching rate for the photoresist film. The organic underlayer film can be processed by using, as an etching gas, an oxygen-containing gas that achieves a significantly high etching rate for the resist underlayer film of the present invention. The substrate can be processed by using, as an etching gas, a fluorine-containing gas that achieves a significantly high etching rate for the organic underlayer film.

No particular limitation is imposed on the photoresist material used for the photoresist film formed on the resist underlayer film of the present invention, so long as the material is sensitive to light used for exposure. The material may be either of negative photoresist and positive photoresist materials. Specific examples of the material include, but are not limited to, a positive photoresist material formed of a novolac resin and a 1,2-naphthoquinone diazide sulfonic acid ester; a chemically amplified photoresist material formed of a binder having a group that decomposes with an acid to thereby increase an alkali dissolution rate and a photoacid generator; a chemically amplified photoresist material formed of a low-molecular-weight compound that decomposes with an acid to thereby increase the alkali dissolution rate of the photoresist film, an alkali-soluble binder, and a photoacid generator; and a chemically amplified photoresist material formed of a binder having a group that decomposes with an acid to thereby increase an alkali dissolution rate, a low-molecular-weight compound that decomposes with an acid to thereby increase the alkali dissolution rate of the photoresist film, and a photoacid generator.

Specific examples of commercially available products include, but are not limited to, trade name APEX-E, available from Shipley, trade name PAR710, available from Sumitomo Chemical Company, Limited, and trade name SEPR430, available from Shin-Etsu Chemical Co., Ltd.

Other examples of suitably used materials include fluorine atom-containing polymer-based photoresist described, for example, in Proc. SPIE, Vol. 3999, 330-334 (2000), Proc. SPIE, Vol. 3999, 357-364 (2000), and Proc. SPIE, Vol. 3999, 365-374 (2000).

Subsequently, light exposure is performed through a predetermined mask. The light exposure may involve the use of, for example, a KrF excimer laser (wavelength: 248 nm), an ArF excimer laser (wavelength: 193 nm), or an F2 excimer laser (wavelength: 157 nm).

After the light exposure, post exposure bake may be performed if necessary. The post exposure bake is performed under appropriately determined conditions; i.e., a heating temperature of 70° C. to 150° C. and a heating time of 0.3 minutes to 10 minutes.

The present invention may involve the use of a resist for electron beam lithography or a resist material for EUV lithography in place of the photoresist material.

The resist material for electron beam lithography may be either of negative and positive resist materials. Specific examples of the resist material for electron beam lithography include, but are not limited to, a chemically amplified resist material formed of an acid generator and a binder having a group that decomposes with an acid to thereby change an alkali dissolution rate; a chemically amplified resist material formed of an alkali-soluble binder, an acid generator, and a low-molecular-weight compound that decomposes with an acid to thereby change the alkali dissolution rate of the resist film; a chemically amplified resist material formed of an acid generator, a binder having a group that decomposes with an acid to thereby change an alkali dissolution rate, and a low-molecular-weight compound that decomposes with an acid to thereby change the alkali dissolution rate of the resist; a non-chemically amplified resist material formed of a binder having a group that decomposes with electron beams to thereby change an alkali dissolution rate; and a non-chemically amplified resist material formed of a binder having a moiety that is cut with electron beams to thereby change an alkali dissolution rate. Also in the case of use of such a resist material for electron beam lithography, a resist pattern can be formed by using electron beams as an irradiation source in the same manner as in the case of using the photoresist material.

The resist material for EUV lithography may be a methacrylate resin-based resist material.

Subsequently, development is performed with a developer (e.g., an alkaline developer). When, for example, a positive photoresist material is used, an exposed portion of the photoresist material is removed to thereby form a pattern of the photoresist film.

Specific examples of the developer include, but are not limited to, alkaline aqueous solutions, for example, aqueous solutions of alkali metal hydroxides, such as potassium hydroxide and sodium hydroxide; aqueous solutions of quaternary ammonium hydroxides, such as tetramethylammonium hydroxide, tetraethylammonium hydroxide, and choline; and aqueous solutions of amines, such as ethanolamine, propylamine, and ethylenediamine.

The present invention may involve the use of an organic solvent as a developer. Thus, development is performed with a developer (organic solvent) after light exposure. When, for example, a negative photoresist material is used, an unexposed portion of the photoresist film is removed to thereby form a pattern of the photoresist film.

Specific examples of the organic solvent that may be used as a developer include, but are not limited to, methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate.

If necessary, the developer may contain a surfactant, etc.

The development is performed under appropriately determined conditions; i.e., a temperature of 5° C. to 50° C. and a time of 10 seconds to 600 seconds.

The resultant patterned photoresist film (upper layer) is used as a protective film to thereby remove the resist underlayer film (intermediate layer) of the present invention. Subsequently, the patterned photoresist film and the resist underlayer film (intermediate layer) of the present invention are used as protective films to thereby remove the organic underlayer film (lower layer). Finally, the patterned resist underlayer film (intermediate layer) of the present invention and the organic underlayer film (lower layer) are used as protective films to thereby process the semiconductor substrate.

Firstly, the resist underlayer film (intermediate layer) of the present invention is removed at a portion where the photoresist film has been removed, to thereby expose the semiconductor substrate.

The dry etching of the resist underlayer film of the present invention can be performed with any of gases, such as tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride, chlorine trifluoride, chlorine, trichloroborane, and dichloroborane.

The dry etching of the resist underlayer film is preferably performed with a halogen-containing gas. In general, a photoresist film formed of an organic substance is hard to remove by dry etching with a halogen-containing gas. In contrast, the resist underlayer film of the present invention, which contains numerous silicon atoms, is quickly removed by dry etching with a halogen-containing gas. Therefore, a reduction in the thickness of the photoresist film in association with the dry etching of the resist underlayer film can be suppressed. Thus, the photoresist film can be used in the form of thin film. The dry etching of the resist underlayer film is preferably performed with a fluorine-containing gas. Examples of the fluorine-containing gas include, but are not limited to, tetrafluoromethane ($CF_4$), perfluorocyclobutane ($C_4F_8$), perfluoropropane ($C_3F_8$), trifluoromethane, and difluoromethane ($CH_2F_2$).

Thereafter, the patterned photoresist film and the resist underlayer film of the present invention are used as protective films to thereby remove the organic underlayer film. The organic underlayer film (lower layer) is preferably removed by dry etching with an oxygen-containing gas, since the resist underlayer film of the present invention, which contains numerous silicon atoms, is less likely to be removed by dry etching with an oxygen-containing gas.

Finally, the semiconductor substrate is processed. The processing of the semiconductor substrate is preferably performed by dry etching with a fluorine-containing gas.

Examples of the fluorine-containing gas include, but are not limited to, tetrafluoromethane ($CF_4$), perfluorocyclobutane ($C_4F_8$), perfluoropropane ($C_3F_8$), trifluoromethane, and difluoromethane ($CH_2F_2$).

An organic anti-reflective coating may be formed on the resist underlayer film of the present invention before formation of the photoresist film. No particular limitation is imposed on the composition used for formation of the anti-reflective coating, and, for example, the composition may be appropriately selected from anti-reflective coating compositions that have been conventionally used in a lithographic process. The anti-reflective coating can be formed by a commonly used method, for example, application of the composition with a spinner or a coater, and subsequent baking of the composition.

The substrate to which the resist underlayer film-forming composition (composed of the film-forming composition of the present invention) is applied may have an organic or inorganic anti-reflective coating formed thereon by, for example, a CVD process. The resist underlayer film of the present invention may be formed on the anti-reflective coating. Even in the case where the resist underlayer film of the present invention is formed on the organic underlayer film formed on the substrate, the substrate used may have an organic or inorganic anti-reflective coating formed thereon by, for example, a CVD process.

The resist underlayer film formed from the resist underlayer film-forming composition of the present invention may absorb light used in a lithographic process depending on the wavelength of the light. In such a case, the resist underlayer film can function as an anti-reflective coating having the effect of preventing reflection of light from the substrate. Furthermore, the resist underlayer film of the present invention can be used as, for example, a layer for preventing the interaction between the substrate and the photoresist film; a layer having the function of preventing the adverse effect, on the substrate, of a material used for the photoresist film or a substance generated during the exposure of the photoresist film to light; a layer having the function of preventing diffusion of a substance generated from the substrate during heating and baking to the upper photoresist film; and a barrier layer for reducing a poisoning effect of a dielectric layer of the semiconductor substrate on the photoresist film.

The resist underlayer film formed from the resist underlayer film-forming composition of the present invention can be applied to a substrate having via holes for use in a dual damascene process, and can be used as an embedding material to fill up the holes. The resist underlayer film can also be used as a planarization material for planarizing the surface of a semiconductor substrate having irregularities.

The resist underlayer film functions as an EUV resist underlayer film or a hard mask. In addition, the resist underlayer film can be used for the following purposes. The resist underlayer film-forming composition of the present invention can be used for forming an anti-reflective underlayer coating of EUV resist film capable of, without intermixing with an EUV resist, preventing the reflection, from a substrate or an interface, of exposure light undesirable for EUV exposure (e.g., the aforementioned deep ultraviolet (DUV) light). The resist underlayer film can efficiently prevent the light reflection as the underlayer film of the EUV resist film. When the resist underlayer film is used as an EUV resist underlayer film, the film can be processed in the same manner as in the photoresist underlayer film.

A semiconductor substrate can be suitably processed by using a semiconductor processing substrate including the above-described resist underlayer film of the present invention and a semiconductor substrate.

A semiconductor substrate can be precisely processed at high reproducibility by a semiconductor device production method including a step of forming an organic underlayer film on a semiconductor substrate; a step of forming a resist underlayer film on the organic underlayer film from the film-forming composition of the present invention; a step of forming a resist film on the resist underlayer film; a step of exposing the resist film to light; a step of developing the resist film with a solvent after the light exposure, to thereby form a resist pattern; a step of etching the resist underlayer film with the resist pattern; and a step of processing the semiconductor substrate with the patterned resist film and resist underlayer film. Thus, it is expected that the method can stably produce a semiconductor device.

EXAMPLES

The present invention will next be described in more detail with reference to Synthesis Examples and Examples, but the present invention should not be construed as being limited to the following Examples.

Synthesis Example 1

A 100-mL flask was charged with 11.1 g of tetraethoxysilane, 2.72 g of methyltriethoxysilane, 2.18 g of (4-(1-ethoxyethoxy)phenyl)trimethoxysilane, and 24.1 g of acetone, and then the mixture was stirred. While the resultant solution was stirred with a magnetic stirrer, 13.8 g of aqueous nitric acid solution (concentration: 0.01 mol/L) was added dropwise to the solution.

After completion of the dropwise addition, the flask was transferred to an oil bath set at 85° C., and the mixture was refluxed for 1,200 minutes. After the reaction mixture was cooled to room temperature, 61 g of propylene glycol monoethyl ether and 6 g of water were added to the mixture, and then acetone, methanol, ethanol, and water were distilled off under reduced pressure, to thereby prepare a hydrolysis condensate (polymer) concentrate containing propylene glycol monoethyl ether as a solvent. The resultant concentrate was found to have a solid content concentration of more than 20% by mass in terms of solid residue content when heated at 140° C.

Subsequently, propylene glycol monoethyl ether was added to the resultant concentrate so as to achieve a concentration of 13% by mass in terms of solid residue content when heated at 140° C., to thereby produce a hydrolysis condensate (polymer) solution containing propylene glycol monoethyl ether as a solvent (solid content concentration: 13% by mass). The resultant polymer was found to have a structure of Formula (E1) and a weight average molecular weight (Mw) of 2,400 as determined by GPC in terms of polystyrene.

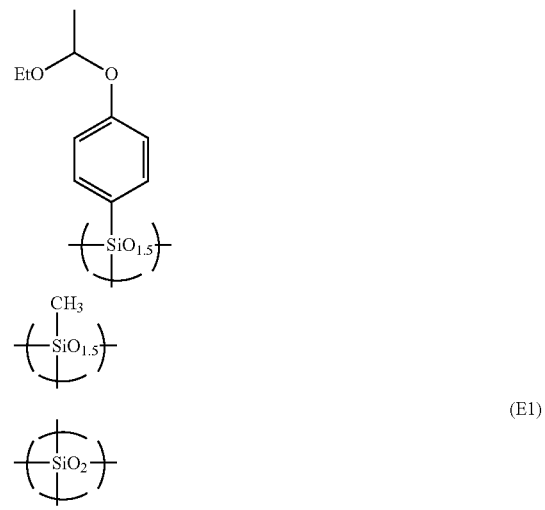

(E1)

Synthesis Example 2

A hydrolysis condensate (polymer) solution (solid content concentration: 13% by mass) was produced in the same manner as in Synthesis Example 1, except that 2.18 g of (4-(1-ethoxyethoxy)phenyl)trimethoxysilane was replaced with 1.80 g of trimethoxy(3-(2-oxiranylmethoxy)propyl)silane. The resultant polymer was found to have a structure of Formula (E2) and a weight average molecular weight (Mw) of 7,000 as determined by GPC in terms of polystyrene.

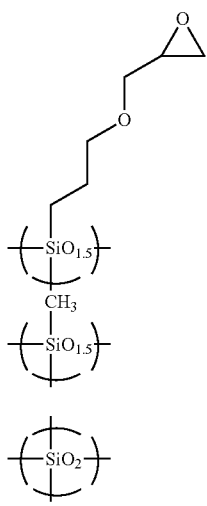

(E2)

Synthesis Example 3

A hydrolysis condensate (polymer) solution (solid content concentration: 13% by mass) was produced in the same manner as in Synthesis Example 1, except that 2.18 g of (4-(1-ethoxyethoxy)phenyl)trimethoxysilane was replaced with 1.80 g of trimethoxy(3-(2-oxiranylmethoxy)propyl) silane. The resultant polymer was found to have a structure of Formula (E3) and a weight average molecular weight (Mw) of 4,000 as determined by GPC in terms of polystyrene.

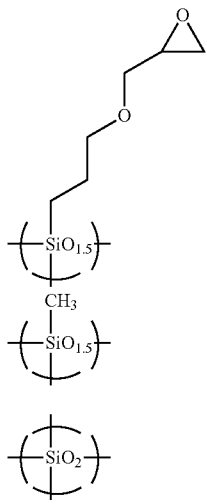

(E3)

Synthesis Example 4

A hydrolysis condensate (polymer) solution (solid content concentration: 13% by mass) was produced in the same manner as in Synthesis Example 1, except that 2.18 g of (4-(1-ethoxyethoxy)phenyl)trimethoxysilane was replaced with 2.63 g of triethoxy((4-methoxymethyl-2-methoxyphenoxy)methyl)silane. The resultant polymer was found to have a structure of Formula (E4) and a weight average molecular weight (Mw) of 3,000 as determined by GPC in terms of polystyrene.

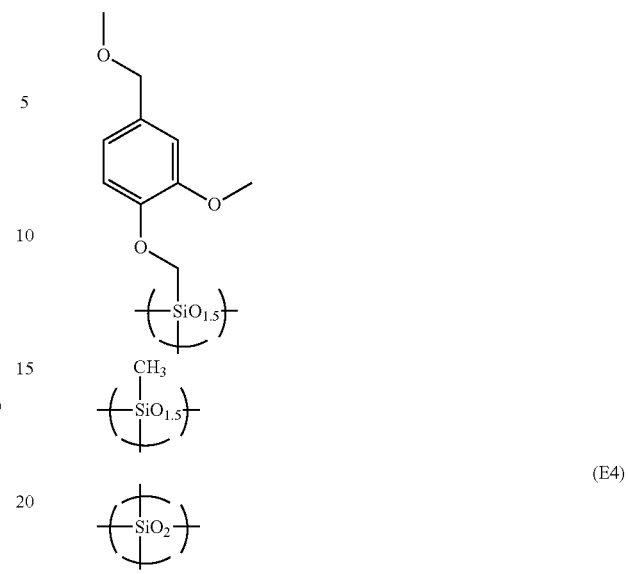

(E4)

[2] Preparation of Film-Forming Composition

Examples 1 to 12 and Comparative Examples 1 to 4

Each of the hydrolysis condensates (polymers) produced in Synthesis Examples 1 to 4, an additive (stabilizer), a curing catalyst (condensing agent), a photoacid generator (acid catalyst for organic crosslinking), a crosslinking agent, and a solvent were mixed in proportions shown in Table 1, and the resultant mixture was filtered with a fluororesin-made filter (0.1 μm), to thereby prepare a film-forming composition (Examples 1 to 12).

Each of the hydrolysis condensates (polymers) produced in Synthesis Examples 1 to 3, a crosslinking agent (condensing agent), a photoacid generator (acid catalyst for organic crosslinking), and a solvent were mixed in proportions shown in Table 2, and the resultant mixture was filtered with a fluororesin-made filter (0.1 μm), to thereby prepare a film-forming composition (Comparative Examples 1 to 4).

The amount of each polymer shown in Tables 1 and 2 corresponds not to the amount of the polymer solution, but to the amount of the polymer itself.

In the following Tables, the amount of each component added is shown by part(s) by mass. MA denotes maleic acid (additive); TPSNO3, triphenylsulfonium nitrate (curing catalyst); TPSTf, triphenylsulfonium trifluoromethanesulfonate (photoacid generator (acid catalyst for organic crosslinking)); and THPSTf, tris(4-hydroxyphenyl)sulfonium trifluoromethanesulfonate (photoacid generator (acid catalyst for organic crosslinking)). PL denotes 1,3,4,6-tetrakis(methoxymethyl)tetrahydroimidazo[4,5-d]imidazole-2,5(1H,3H)-dione (crosslinking agent); and TMOM-BP, 3,3',5,5'-tetrakis(methoxymethyl)-[1,1'-biphenyl]-4,4'-diol (crosslinking agent). PGMEA denotes propylene glycol monomethyl ether acetate (solvent); PGME, propylene glycol monomethyl ether (solvent); PGEE, propylene glycol monoethyl ether (solvent); and DIW, ultrapure water (deionized water) (solvent).

TABLE 1

| | Si polymer solution | Additive | Curing catalyst | Acid catalyst | Cross-linking agent | Solvent composition | | | |
|---|---|---|---|---|---|---|---|---|---|
| Example 1 | Synthesis Example 1 | MA | TPSNO3 | — | PL | PGMEA | PGME | PGEE | DIW |
| (part(s) by mass) | 1 | 0.03 | 0.01 | | 0.05 | 10 | 8 | 70 | 12 |
| Example 2 | Synthesis Example 1 | MA | TPSNO3 | — | TMOM-BP | PGMEA | PGME | PGEE | DIW |
| (part(s) by mass) | 1 | 0.03 | 0.01 | | 0.05 | 10 | 8 | 70 | 12 |
| Example 3 | Synthesis Example 1 | MA | TPSNO3 | TPSTf | PL | PGMEA | PGME | PGEE | DIW |
| (part(s) by mass) | 1 | 0.03 | 0.01 | 0.03 | 0.05 | 10 | 8 | 70 | 12 |
| Example 4 | Synthesis Example 1 | MA | TPSNO3 | THPSTf | PL | PGMEA | PGME | PGEE | DIW |
| (part(s) by mass) | 1 | 0.03 | 0.01 | 0.03 | 0.05 | 10 | 8 | 70 | 12 |
| Example 5 | Synthesis Example 1 | MA | TPSNO3 | THPSTf | TMOM-BP | PGMEA | PGME | PGEE | DIW |
| (part(s) by mass) | 1 | 0.03 | 0.01 | 0.03 | 0.05 | 10 | 8 | 70 | 12 |
| Example 6 | Synthesis Example 1 | MA | TPSNO3 | THPSTf | PL | PGMEA | PGME | PGEE | DIW |
| (part(s) by mass) | 1 | 0.03 | 0.01 | 0.03 | 0.1 | 10 | 8 | 70 | 12 |
| Example 7 | Synthesis Example 2 | MA | TPSNO3 | — | PL | PGMEA | PGME | PGEE | DIW |
| (part(s) by mass) | 1 | 0.03 | 0.01 | | 0.05 | 10 | 8 | 70 | 12 |
| Example 8 | Synthesis Example 2 | MA | TPSNO3 | THPSTf | PL | PGMEA | PGME | PGEE | DIW |
| (part(s) by mass) | 1 | 0.03 | 0.01 | 0.03 | 0.05 | 10 | 8 | 70 | 12 |
| Example 9 | Synthesis Example 3 | MA | TPSNO3 | — | PL | PGMEA | PGME | PGEE | DIW |
| (part(s) by mass) | 1 | 0.03 | 0.01 | | 0.01 | 10 | 8 | 70 | 12 |
| Example 10 | Synthesis Example 3 | MA | TPSNO3 | — | PL | PGMEA | PGME | PGEE | DIW |
| (part(s) by mass) | 1 | 0.03 | 0.01 | | 0.05 | 10 | 8 | 70 | 12 |
| Example 11 | Synthesis Example 4 | MA | TPSNO3 | THPSTf | PL | PGMEA | PGME | PGEE | DIW |
| (part(s) by mass) | 1 | 0.03 | 0.01 | 0.03 | 0.05 | 10 | 8 | 70 | 12 |
| Example 12 | Synthesis Example 4 | MA | TPSNO3 | THPSTf | TMOM-BP | PGMEA | PGME | PGEE | DIW |
| (part(s) by mass) | 1 | 0.03 | 0.01 | 0.03 | 0.05 | 10 | 8 | 70 | 12 |

TABLE 2

| | Si polymer solution | Additive | Curing catalyst | Acid catalyst | Cross-linking agent | Solvent composition | | | |
|---|---|---|---|---|---|---|---|---|---|
| Comparative Example 1 | Synthesis Example 1 | MA | TPSNO3 | — | — | PGMEA | PGME | PGEE | DIW |
| (part(s) by mass) | 1 | 0.03 | 0.01 | | | 10 | 8 | 70 | 12 |
| Comparative Example 2 | Synthesis Example 2 | MA | TPSNO3 | — | — | PGMEA | PGME | PGEE | DIW |
| (part(s) by mass) | 1 | 0.03 | 0.01 | | | 10 | 8 | 70 | 12 |
| Comparative Example 3 | Synthesis Example 1 | MA | TPSNO3 | THPSTf | — | PGMEA | PGME | PGEE | DIW |
| (part(s) by mass) | 1 | 0.03 | 0.01 | 0.03 | | 10 | 8 | 70 | 12 |
| Comparative Example 4 | Synthesis Example 3 | MA | — | TPSTf | — | PGMEA | PGME | PGEE | DIW |
| (part(s) by mass) | 1 | 0.03 | | 0.01 | | 10 | 8 | 70 | 12 |

(Preparation of Composition for Forming Organic Underlayer Film A)

In a nitrogen atmosphere, a 100-mL four-necked flask was charged with 6.69 g (0.040 mol) of carbazole (available from Tokyo Chemical Industry Co., Ltd.), 7.28 g (0.040 mol) of 9-fluorenone (available from Tokyo Chemical Industry Co., Ltd.), and 0.76 g (0.0040 mol) of p-toluenesulfonic acid monohydrate (available from Tokyo Chemical Industry Co., Ltd.), and then 6.69 g of 1,4-dioxane (available from KANTO CHEMICAL CO., INC.) was added to the flask. The resultant mixture was stirred and heated to 100° C. for dissolution, to thereby initiate polymerization. After the elapse of 24 hours, the mixture was left to cool to 60° C. Thereafter, the mixture was diluted with 34 g of chloroform (available from KANTO CHEMICAL CO., INC.), and then reprecipitated in 168 g of methanol (available from KANTO CHEMICAL CO., INC.). The resultant precipitate was filtered, and the filtrate was dried with a reduced-pressure dryer at 80° C. for 24 hours, to thereby yield 9.37 g of a target polymer of Formula (EA1) (hereinafter abbreviated as "PCzFL").

Formula (EA1)

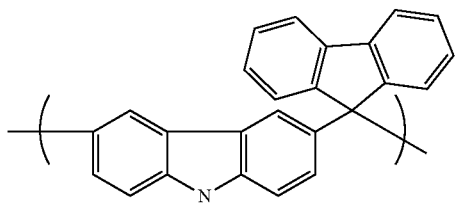

The results of $^1$H-NMR analysis of PCzFL were as follows:
$^1$H-NMR (400 MHz, DMSO-$d_6$): δ7.03-7.55 (br, 12H), δ7.61-8.10 (br, 4H), δ11.18 (br, 1H).

PCzFL was found to have a weight average molecular weight Mw of 2,800 as determined by GPC in terms of polystyrene and a polydispersity Mw/Mn of 1.77.

Subsequently, 20 g of the resultant polymer was mixed with 3.0 g of tetramethoxymethyl glycoluril (trade name: Powderlink 1174, available from Mitsui Cytec Ltd.) serving as a crosslinking agent, 0.30 g of pyridinium p-toluenesulfonate serving as a catalyst, and 0.06 g of MEGAFAC R-30 (trade name, available from Dainippon Ink and Chemicals, Inc.) serving as a surfactant, and the mixture was dissolved in 88 g of propylene glycol monomethyl ether acetate, to thereby prepare a solution. Thereafter, the solution was filtered with a polyethylene-made microfilter (pore size: 0.10 μm), and then filtered with a polyethylene-made microfilter (pore size: 0.05 μm), to thereby prepare a composition for forming an organic underlayer film A used for a lithographic process using a multilayer film.

(Preparation of Composition for Forming Organic Underlayer Film B)

In a nitrogen atmosphere, a 100-mL four-necked flask was charged with 40.0 g of 2-epoxy-4-(2-oxiranyl)cyclohexyl adduct (trade name: EHPE3150, available from Daicel Corporation), 20.3 g of 9-anthracenecarboxylic acid, 13.7 g of benzoic acid (first grade, available from KANTO CHEMICAL CO., INC.), 1.5 g of BTEAC (available from Tokyo Chemical Industry Co., Ltd.), and g (mol) of PGME serving as a solvent, and the resultant mixture was refluxed at 142° C. for 20 hours, to thereby allow reaction to proceed. After completion of the reaction, the resultant reaction mixture was subjected to ion exchange with an ion-exchange resin for four hours with stirring, followed by filtration, to thereby yield a yellow solution. The resultant polymer was subjected to GPC analysis, and the polymer was found to have a weight average molecular weight of 4,100 in terms of standard polystyrene. Subsequently, 5 g of the resultant polymer solution (polymer solid content: 16% by weight) was mixed with 0.2 g of tetraethoxymethyl glycoluril, 0.03 g of pyridinium-p-toluenesulfonate, 0.0008 g of MEGAFAC [registered trademark] R-30 (trade name, available from DIC Corporation), 6.4 g of propylene glycol monomethyl ether, and 4.5 g of propylene glycol monomethyl ether acetate, to thereby prepare a solution. Thereafter, the solution was filtered with a polyethylene-made microfilter (pore size: 0.10 μm), and then filtered with a polyethylene-made microfilter (pore size: 0.05 μm), to thereby prepare a composition for forming an organic underlayer film B used for a lithographic process using a multilayer film.

(Formation of Resist Pattern by EB Exposure: Negative Solvent Development)

The aforementioned composition for forming an organic underlayer film B was applied onto a silicon wafer by spin coating, and then heated on a hot plate at 215° C. for one minute, to thereby form an organic underlayer film (layer B) (thickness: 200 nm).

The film-forming composition of Example 1 was applied onto the organic underlayer film by spin coating, and then heated on a hot plate at 215° C. for one minute, to thereby form a resist underlayer film (20 nm).

An EUV resist solution (hydroxystyrene resin-based resist) was applied onto the resist underlayer film by spin coating, and then heated on a hot plate at 130° C. for one minute, to thereby form an EUV resist film. Thereafter, the EUV resist film was exposed to light (lithography) with an EB exposure apparatus (ELS-G130, available from Elionix) under the following conditions: exposure range: 200 to 800 uC/cm2, step: 40 uC/cm$^2$.

After the light exposure, post exposure bake (at 90° C. for one minute) was performed, and the resultant product was cooled on a cooling plate to room temperature, followed by development with an organic solvent developer (butyl acetate) for 25 seconds and subsequent rinsing treatment, to thereby form a resist pattern.

Each of the compositions prepared in Examples 2, 7, 9, and 10 and Comparative Examples 1, 2, and 4 was used, and a resist pattern was formed through the same procedure as described above.

Each of the thus-formed resist patterns was evaluated for formation of a 25 nm line-and-space. The results are shown in Tables 3 to 5. In the evaluation results of the pattern shape shown in Tables 3 to 5, evaluation "Poor" or "Good" was respectively given when a minimum CD size without pattern collapse was 20 nm or more or less than 20 nm in association with a change in exposure amount at a line-and-space of 50 nm pitch.

TABLE 3

| Film-forming composition | Reaction unit | Crosslinking agent | Curing catalyst (1%) | Pattern shape |
| --- | --- | --- | --- | --- |
| Example 1 | (4-(1-ethoxy-ethoxy)phenyl)trimethoxysilane | PL | TPSNO3 | Good |
| Example 2 | (4-(1-ethoxy-ethoxy)phenyl)trimethoxysilane | TMOM-BP | TPSNO3 | Good |

TABLE 3-continued

| Film-forming composition | Reaction unit | Crosslinking agent | Curing catalyst (1%) | Pattern shape |
|---|---|---|---|---|
| Comparative Example 1 | (4-(1-ethoxy-ethoxy)phenyl)trimethoxysilane | — | TPSNO3 | Poor |

TABLE 4

| Film-forming composition | Reaction unit | Crosslinking agent | Curing catalyst (1%) | Pattern shape |
|---|---|---|---|---|
| Example 7 | Trimethoxy(3-(2-oxiranylmethoxy)propyl)silane | PL | TPSNO3 | Good |
| Comparative Example 4 | Trimethoxy(3-(2-oxiranylmethoxy)propyl)silane | — | TPSNO3 | Poor |

TABLE 5

| Film-forming composition | Reaction unit | Crosslinking agent | Pattern shape |
|---|---|---|---|
| Example 9 | Trimethoxy(3-(2-oxiranylmethoxy)propyl)silane | PL | Good |
| Example 10 | Trimethoxy(3-(2-oxiranylmethoxy)propyl)silane | PL | Good |
| Comparative Example 2 | Trimethoxy(3-(2-oxiranylmethoxy)propyl)silane | — | Poor |

As shown in Tables 3 to 5, a good pattern shape was achieved through addition of a phenoplast crosslinking agent and an aminoplast crosslinking agent in the system using a phenol polymer, addition of an aminoplast crosslinking agent in the system using an epoxy-unit-containing polymer, and addition of an aminoplast crosslinking agent in the system using an epoxy-unit-containing polymer system.

(Formation of Resist Pattern by EUV Exposure: Negative Solvent Development)

The aforementioned composition for forming an organic underlayer film A was applied onto a silicon wafer by spin coating, and then heated on a hot plate at 215° C. for one minute, to thereby form an organic underlayer film (layer A) (thickness: 60 nm).

The film-forming composition of Example 3 was applied onto the organic underlayer film by spin coating, and then heated on a hot plate at 215° C. for one minute, to thereby form a resist underlayer film (20 nm).

An EUV resist solution (hydroxystyrene resin-based resist) was applied onto the resist underlayer film by spin coating, and then heated on a hot plate at 130° C. for one minute, to thereby form an EUV resist film (layer C). Thereafter, the EUV resist film was exposed to light (lithography) with an EUV exposure apparatus (NXE3300, available from ASML) under the following conditions: NA: 0.33, σ: 0.671/0.902, Dipole.

After the light exposure, post exposure bake (at 90° C. for one minute) was performed, and the resultant product was cooled on a cooling plate to room temperature, followed by development with an organic solvent developer (butyl acetate) for one minute and subsequent rinsing treatment, to thereby form a resist pattern.

Each of the compositions prepared in Examples 4 to 6, 8, 11, and 12 and Comparative Example 3 was used, and a resist pattern was formed through the same procedure as described above.

Each of the thus-formed resist patterns was evaluated for formation of a 20 nm line-and-space. The results are shown in Table 6. In the evaluation results of the pattern shape shown in Table 6, evaluation "Poor" or "Good" was respectively given when a minimum CD (critical dimension) size without pattern collapse at best focus was 18 nm or more or less than 18 nm in association with a change in exposure amount at a line-and-space of 40 nm pitch in EUV lithography. The term "best focus" as used herein corresponds to a focal point where a pattern contrast is most clearly observed during light exposure with varying focal depths.

TABLE 6

| Film-forming composition | Reaction unit | Crosslinking agent | Curing catalyst (1%) | Acid catalyst | Pattern shape |
|---|---|---|---|---|---|
| Example 3 | (4-(1-ethoxyethoxy)phenyl)trimethoxysilane | 5% PL | TPSNO3 | 3% TPSTf | Good |
| Example 4 | (4-(1-ethoxyethoxy)phenyl)trimethoxysilane | 5% PL | TPSNO3 | 3% THPSTf | Good |
| Example 5 | (4-(1-ethoxyethoxy)phenyl)trimethoxysilane | 5% TMOM-BP | TPSNO3 | 3% THPSTf | Good |
| Example 6 | (4-(1-ethoxyethoxy)phenyl)trimethoxysilane | 10% PL | TPSNO3 | 3% THPSTf | Good |
| Example 8 | Trimethoxy(3-(2-oxiranylmethoxy)propyl)silane | 5% PL | TPSNO3 | 3% THPSTf | Good |
| Example 11 | Triethoxy((2-methoxy-4-(methoxymethyl)phenoxy)methyl)silane | 5% PL | TPSNO3 | 3% THPSTf | Good |
| Example 12 | Triethoxy((2-methoxy-4-(methoxymethyl)phenoxy)methyl)silane | 5% TMOM-BP | TPSNO3 | 3% THPSTf | Good |
| Comparative Example 3 | (4-(1-ethoxyethoxy)phenyl)trimethoxysilane | — | TPSNO3 | 3% TPSTf | Poor |

As shown in Tables 3 to 6, in the case of the resist underlayer film formed from each of the film-forming compositions prepared in Examples 1 to 12, the pattern collapse of a resist film provided on the resist underlayer film was prevented, and a favorable resist pattern was formed in the above-described negative resist pattern formation tests by EB exposure and EUV exposure, as compared with the case of the resist underlayer film formed from each of the film-forming compositions prepared in Comparative Examples 1 to 4 containing no crosslinking agent.

The invention claimed is:

1. A film-forming composition comprising
   a hydrolysis condensate of a hydrolyzable silane compound,
   at least one selected from the group consisting of an aminoplast crosslinking agent and a phenoplast crosslinking agent, and
   a solvent,
   the film-forming composition wherein:
   the hydrolyzable silane compound contains a hydrolyzable silane of the following Formula (1):

  (1)

wherein $R^1$ is a group bonded to the silicon atom via an Si—C bond, and is an organic group containing at least one structure selected from among an alkoxymethylbenzene structure, a phenoxy structure, and an epoxy structure;
   $R^2$ is a group bonded to the silicon atom via an Si—C bond, and is each independently a substitutable alkyl group, a substitutable aryl group, a substitutable aralkyl group, a substitutable halogenated alkyl group, a substitutable halogenated aryl group, a substitutable halogenated aralkyl group, a substitutable alkoxyalkyl group, a substitutable alkoxyaryl group, a substitutable alkoxyaralkyl group, or a substitutable alkenyl group, or an organic group containing an epoxy group, an acryloyl group, a methacryloyl group, a mercapto group, an amino group, an amide group, an alkoxy group, or a sulfonyl group, or any combination of these;
   $R^3$ is a group or atom bonded to the silicon atom, and is each independently a hydroxy group, an alkoxy group, an aralkyloxy group, an acyloxy group, or a halogen atom;
   a is an integer of 1;
   b is an integer of 0 to 2; and
   a+b is an integer of 1 to 3), and
   the hydrolyzable silane compound further contains a hydrolyzable silane of the following Formula (2):

  (2)

wherein $R^{11}$ is a group or atom bonded to the silicon atom, and is each independently a hydroxy group, an alkoxy group, an aralkyloxy group, an acyloxy group, or a halogen atom, and
   wherein the hydrolysis condensate contains a monomer unit of the hydrolyzable silane of Formula (1) in an amount of 0.1% by mole to 15% by mole.

2. The film-forming composition according to claim 1, wherein the organic group containing a phenoxy structure is an organic group containing a phenol structure, an alkoxyalkoxybenzene structure, or an alkoxybenzene structure.

3. The film-forming composition according to claim 1, wherein the organic group containing an alkoxymethylbenzene structure is an organic group containing an (alkoxy)(alkoxymethyl)benzene structure.

4. The film-forming composition according to claim 1, wherein the hydrolyzable silane compound further contains a hydrolyzable silane of the following Formula (3):

  (3)

wherein $R^{12}$ is a group bonded to the silicon atom via an Si—C bond, and is each independently a substitutable alkyl group, a substitutable aryl group, a substitutable aralkyl group, a substitutable halogenated alkyl group, a substitutable halogenated aryl group, a substitutable halogenated aralkyl group, a substitutable alkoxyalkyl group, a substitutable alkoxyaryl group, a substitutable alkoxyaralkyl group, or a substitutable alkenyl group, or an organic group containing an epoxy group, an acryloyl group, a methacryloyl group, a mercapto group, an amino group, an amide group, an alkoxy group, or a sulfonyl group, or any combination of these; and
$R^{13}$ is a group or atom bonded to the silicon atom, and is each independently a hydroxy group, an alkoxy group, an aralkyloxy group, an acyloxy group, or a halogen atom).

5. The film-forming composition according to claim 1, wherein the composition further comprises an acid catalyst.

6. The film-forming composition according to claim 5, wherein the acid catalyst contains at least one selected from the group consisting of a triphenylsulfonium trifluoromethanesulfonic acid salt and a tris(hydroxyphenyl)sulfonium trifluoromethanesulfonic acid salt.

7. The film-forming composition according to claim 1, wherein the composition further comprises a curing catalyst.

8. The film-forming composition according to claim 7, wherein the curing catalyst contains at least one selected from the group consisting of an ammonium salt, a phosphine compound, a phosphonium salt, and a sulfonium salt.

9. The film-forming composition according to claim 1, wherein the hydrolyzable silane of Formula (1) is (4-(1-ethoxyethoxy)phenyl)trimethoxysilane, or trimethoxy(3-(2-oxiranylmethoxy)propyl)silane, or triethoxy ((4-ethoxy-2-methoxyphenoxy)methyl)silane.

10. The film-forming composition according to claim 1, wherein the composition is for forming a resist underlayer film used in a lithographic process.

11. The film-forming composition according to claim 10, wherein the lithographic process is an EB lithography or EUV lithography process.

12. A resist underlayer film formed from the film-forming composition according to claim 1.

13. A semiconductor processing substrate comprising a semiconductor substrate, and the resist underlayer film according to claim 12.

14. A method for producing the film-forming composition according to claim 1, the method comprising:
   a step of producing the hydrolysis condensate by hydrolysis and condensation of the hydrolyzable silane compound in the presence of nitric acid; and
   a step of dissolving, in a solvent, the hydrolysis condensate and at least one selected from the group consisting of the aminoplast crosslinking agent and the phenoplast crosslinking agent.

15. A method for producing a semiconductor device, the method comprising:
   a step of forming a resist underlayer film on a semiconductor substrate from the film-forming composition according to claim 1;
   a step of forming a resist film on the resist underlayer film;
   a step of exposing the resist film to light;

a step of developing the resist film with a solvent after the light exposure, to thereby form a resist pattern;

a step of etching the resist underlayer film with the resist pattern; and a step of processing the semiconductor substrate with the patterned resist film and resist underlayer film.

16. A method for producing a semiconductor device, the method comprising:

a step of forming an organic underlayer film on a semiconductor substrate;

a step of forming a resist underlayer film on the organic underlayer film from the film-forming composition according to claim 1;

a step of forming a resist film on the resist underlayer film;

a step of exposing the resist film to light;

a step of developing the resist film with a solvent after the light exposure, to thereby form a resist pattern;

a step of etching the resist underlayer film with the resist pattern; and a step of processing the semiconductor substrate with the patterned resist film and resist underlayer film.

17. The film-forming composition according to claim 1, wherein $R^1$ in Formula (1) is an organic group containing at least one structure selected from among an alkoxymethylbenzene structure and an epoxy structure.

* * * * *